(12) United States Patent
Scalora et al.

(10) Patent No.: US 7,075,610 B2
(45) Date of Patent: Jul. 11, 2006

(54) LIQUID CRYSTAL DISPLAY DEVICE AND LIGHT EMITTING STRUCTURE WITH PHOTONIC BAND GAP TRANSPARENT ELECTRODE STRUCTURES

(76) Inventors: Michael Scalora, 15037 Ashmont Cir., Huntsville, AL (US) 35803; Mark Bloemer, 15829 Sanderson La., Athens, AL (US) 35613

( * ) Notice: Subject to any disclaimer, the term of this patent is extended or adjusted under 35 U.S.C. 154(b) by 692 days.

(21) Appl. No.: 09/782,517

(22) Filed: Feb. 14, 2001

(65) Prior Publication Data
US 2002/0021479 A1    Feb. 21, 2002

Related U.S. Application Data

(63) Continuation-in-part of application No. 08/931,756, filed on Sep. 16, 1997, now Pat. No. 6,262,830.

(60) Provisional application No. 60/186,762, filed on Mar. 3, 2000.

(51) Int. Cl.
*G02F 1/1343*    (2006.01)

(52) U.S. Cl. .................. 349/147; 349/143; 349/104; 349/162

(58) Field of Classification Search ........ 349/140–143, 349/443, 147; 359/585, 584
See application file for complete search history.

(56) References Cited

U.S. PATENT DOCUMENTS

| | | | | |
|---|---|---|---|---|
| 4,507,547 A | * | 3/1985 | Taga et al. ............. | 219/543 |
| 4,556,288 A | * | 12/1985 | Sekimura ............... | 349/137 |
| 5,595,825 A | * | 1/1997 | Guiselin ................. | 428/428 |
| 5,703,436 A | | 12/1997 | Forrest et al. .......... | 313/506 |
| 5,760,423 A | | 6/1998 | Kamakura et al. ..... | 257/99 |
| 5,844,649 A | * | 12/1998 | Yamahara et al. ...... | 349/118 |
| 6,014,196 A | | 1/2000 | Anzaki et al. .......... | 349/137 |
| 6,304,366 B1 | | 10/2001 | Scalora et al. | |
| 6,586,775 B1 | * | 7/2003 | Hirayama ............... | 257/98 |

FOREIGN PATENT DOCUMENTS

WO    WO 99/15922    4/1999
WO    WO99/15922 A2    4/1999

OTHER PUBLICATIONS

Bloemer, M., et al.; "Transparent Metal Electrodes: The Photonic Band Gap Approach"; Jul. 1998; SPIE vol. 3476; pp. 217-224; Part of the SPIE Conference on Organic Light-Emitting Materials and Devices II, 1998.

(Continued)

*Primary Examiner*—Andrew Schechter
*Assistant Examiner*—Richard H Kim
(74) *Attorney, Agent, or Firm*—Venable LLP; Robert S. Babayi

(57) ABSTRACT

An LCD device for displaying an image includes pixel control electrodes constructed as a transparent metal stack having a photonic band gap (PBG) structure that transmits a visible range of wavelengths and suppresses a non-visible range of wavelengths. A liquid crystal layer between the pixel control electrodes controls the transmission of light in response to a voltage applied across the pixel control electrodes. A light emitting structure (LES), such as a light emitting diode (LED) or light emitting polymer (LEP) device includes a cathode electrode, a substrate, an active layer for emitting visible light, and a transparent anode electrode having a PBG structure.

30 Claims, 16 Drawing Sheets

OTHER PUBLICATIONS

Bloemer, M., et al.; "Transmissive Properties of Ag/MgF$_2$ Photonic Band Gap"; Apr. 6, 1998; Applied Physics Letters vol. 72, No. 14; pp. 1676-1678; American Institute of Physics, 1998.

Copy of International Search Report, Application No. PCT/US01/06640, Issued Sep. 17, 2001, 4 pages.

Felbacq, "Wave Propagation in one-dimensional photonic crystals", Optics Communication 152 (1998) pp. 119-126.

Blomer et al., "Transparent metal electrodes: The photonic band gap approach", Part of SPIE Conference on Organic Light-Emitting Materials an Devices, II, San Diego, CA Jul. 1998, pp. 217-224.

Scalora et al., "Transparent, metallo-dielectric, one-dimensional, photonic band-gap structures", Journal of Applied Physics, vol. 83, No. 5, Mar. 1, 1998, pp. 2377-2383.

Contopanagos et al., "Electromagnetic properties of periodic multilayers of ultrathin metallic films from dc to ultraviolet frequencies", J. Opt. Soc. Am A/vol. 16, No. 9, Sep. 1999, pp. 2294-2306.

Bennink et al., "Accessing the optical nonlinearity of metals with metal-dielectric photonic bandgap structures", Optics Letters, vol. 24, No. 20, Oct. 15, 1999, pp. 1416-1418.

Yablonovitch, "Inhibited Spontaneous Emission in Solid-State Physics and Electronics", Physical Review Letters, vol. 58, No. 20, May 18, 1987, pp. 2059-2062.

* cited by examiner

LIQUID CRYSTAL DISPLAY DEVICE AND LIGHT EMITTING STRUCTURE WITH PHOTONIC BAND GAP TRANSPARENT ELECTRODE STRUCTURES

CROSS-REFERENCE TO RELATED APPLICATIONS

This application is a continuation-in-part of "Transparent Metallo-Dielectric Photonic Band Gap Structure," Ser. No. 08/931,756, by M. Scalora, filed on Sep. 16, 1997, now issued as U.S. Pat. No. 6,262,830 on Jul. 17, 2001 (incorporated by reference in its entirety herein), and claims the benefit of U.S. Provisional Application No. 60/186,762, filed Mar. 3, 2000.

FEDERALLY SPONSORED RESEARCH AND DEVELOPMENT

This invention was made with Government support under Contract DAAH01-96-P-R010 awarded by the U.S. Army Missile Command. The Government has certain rights in the invention.

BACKGROUND OF THE INVENTION

1. Field of the Invention

This invention relates generally to liquid crystal display (LCD) devices and light emitting structures (LESs), such as light emitting diodes (LEDs) and light emitting polymer (LEP) devices.

2. Related Art

Liquid Crystal Displays are used in many practical display systems including display systems for laptop computers, calculators, personal digital assistants, and cellular telephones. An LCD comprises at least one liquid crystal (LC) cell. The LC cell typically has a layered construction including upper and lower spaced-apart transparent substrates, often made of glass, having inner surfaces encapsulating an LC layer. A transparent conductive layer or electrode, typically made of Indium Tin Oxide (ITO), and a transparent polymer both coat the respective inner surfaces of the transparent substrate layers. The polymer coatings or aligning layers align the orientations of LC molecules in the LC layer and adjacent the aligning layers. A voltage applied across the conductive layers or electrodes establishes an electric field across the LC layer and thereby further controls the LC molecule orientations throughout the LC layer, as is known, to control light passing through the LC cell.

Known LCD device configurations include passive and active LCD matrix displays. Such displays typically include a matrix of transparent ITO pixel electrodes or electrode regions arranged in addressable rows and columns. Each pixel electrode or electrode region defines an image pixel that can be selectively driven, that is, turned on or off by a voltage signal applied to the pixel electrode or electrode region.

As pixel densities increase, the sizes of the pixel electrodes and electrode regions correspondingly decrease. As a result, higher voltages are required to rapidly drive the pixel electrodes or electrode regions. Higher voltages disadvantageously consume more power. Also, as the number of pixels increases with display size and increased pixel density, even more power is required to drive a higher number of pixel electrodes covering a larger area of the LCD.

In matrix LCD applications, scanning voltage signals used to select and drive the pixel electrodes operate at relatively high frequencies, for example, in color television applications, pixel electrodes are scanned at frequencies of up to 23 MHZ. Also, there is a constant push to increase refresh rates in many types of LCD devices. There is therefor an ever increasing need for faster and more responsive LCD devices operating with reduced power consumption.

One factor determining LCD responsiveness and power consumption performance is the electron mobility and thus conductivity of the transparent pixel electrodes used in the LCD device. For example, an increase in pixel electrode conductivity results in a decrease in the voltage signal level required to drive the pixel electrodes and a corresponding decrease in LCD display power consumption. Such an increase in conductivity also results in a corresponding increase in the responsiveness of the pixel electrode to voltage signals applied thereto. The use of semi-transparent or transparent semiconductors/metal-oxides, such as ITO, as the preferred materials for the pixel electrodes in known LCD devices disadvantageously limits the responsiveness of such pixel electrodes, and also disadvantageously limits the ability of the LCD devices using such pixel electrodes to reduce power consumption. Such disadvantages result from the relatively poor conductivity of the semiconductor material in relation to other materials, such as metals. For example, the conductivity of a semiconductor material such as ITO is between 100 and 1000 times less than the conductivity of a metal.

Another known problem associated with LCD displays is an annoying display glare caused in part by the undesirable reflection of visible light from the surfaces of the transparent semiconductor/metal-oxide electrodes.

Accordingly, there is a need to increase responsiveness and reduce power consumption in LCD display devices.

There is a further need to reduce undesired display glare in the LCD devices.

Light emitting structures, such as LEDs and LEPs, are also used in many practical display systems including display systems for laptop computers, calculators, personal digital assistants, and cellular telephones. A light emitting structure (LES) typically comprises spaced-apart cathode and semi-transparent anode electrodes and an active layer between the spaced electrodes. In the case of an LED, the active layer includes an active semiconductor layer. In the case of a light emitting polymer (LEP) device, the active layer includes an active polymer. When voltages are applied to the anode and cathode electrodes, a voltage potential difference develops across the active semiconductor or polymer layer and causes the active layer to emit visible light. The emitted visible light is at least partially transmitted through the semi-transparent anode. A known LED for emitting light, such as blue light, includes an anode electrode made of a semi-transparent semiconductor, such as ITO. Use of the ITO composition has disadvantages as mentioned above in connection with LCDs.

A typical LEP structure is similar in nature to an LED. That is, it is composed of a polymer material sandwiched between two electrodes. In a known LEP, one of the two electrodes can be ITO, while the other can be a silver mirror. LEPs have entered the scene more recently than LEDs and are sometimes preferred over LEDs because LEPs can be easier to manufacture than LEDs. However, the principles of operation for LEDs and LEP remains essentially the same, and their geometries are very similar. Use of the ITO composition in an LEP has disadvantages as mentioned above in connection with an LED and an LCD.

Therefore, there is a need to improve LES (for example, LED and LEP) device performance with respect to at least the semi-transparent anode electrode.

SUMMARY OF THE INVENTION

The present invention replaces a conventional transparent electrode made of a semiconductor/metal-oxide, such as ITO, in an LCD device with a transparent, multilayered electrode, or transparent metal stack, exhibiting a photonic band gap (PBG) structure that transmits a visible range of wavelengths and suppresses a non-visible range of wavelengths of the electromagnetic spectrum. An LCD device for displaying an image in accordance with the present invention comprises first and second spaced transparent electrodes constructed and arranged to have a voltage applied across these transparent electrodes. At least the first transparent electrode, and preferably the second electrode as well, includes a transparent metal stack of the present invention having a layered structure including alternating metal and interstitial layers formed on one another to exhibit a PBG structure for transmitting a visible wavelength range and suppressing a non-visible wavelength range of the electromagnetic spectrum. An LC layer positioned between the first and second transparent electrodes selectively displays an image in response to the voltage applied across the first and second electrodes.

A conductivity of the transparent metal stack of the present invention when all of the metal layers in the metal stack are contacting one another is advantageously 100 to 1000 times greater than a conductivity of conventional semiconductor/metal-oxide transparent materials, such as ITO. The dramatic increase in conductivity arises from the alternating metal layers included in the transparent metal stack. While the transparent metal stack provides a required transparency to light, the dramatic increase in conductivity associated therewith over conventional transparent semiconductor/metal-oxide materials advantageously results in a substantial corresponding increase in a responsiveness or speed of the transparent electrode, and thus the LCD device. Also, the substantial increase in the transparent electrode conductivity advantageously results in a decrease in the voltage signal level and an electrical current required to drive the transparent electrode, to correspondingly decrease a power consumption of the LCD device.

Also, the PBG structure of the transparent electrode either transmits or absorbs light energy directed at the electrode, and therefore, tends not to reflect such energy. This inherent non-reflective property of the PBG structure advantageously reduces annoying glare from LCD devices using the PBG transparent electrodes as compared to conventional LCD devices, because light incident on the transparent electrode tends not to be reflected away from the electrode.

In another aspect of the present invention, a transparent anode electrode having a PBG structure replaces a conventional semi-transparent and/or opaque metal anode electrode made of a semiconductor/metal-oxide, such as ITO, or an opaque metal layer, such as gold, in an LES device, such as an LED or an LEP device. The LES device includes a cathode electrode adapted to have a first voltage applied to the cathode electrode. A substrate layer overlays the cathode electrode, and an active layer overlays the substrate layer. The active layer has the property of emitting light in the visible region of the electromagnetic spectrum when a voltage is applied across the active layer. A transparent anode electrode overlays the active layer and is adapted to have a second voltage applied thereto. The transparent anode electrode includes a transparent metal stack having a layered structure including alternating metal and interstitial layers formed on one another to exhibit a photonic band gap (PBG) structure for transmitting a visible wavelength range of the EM spectrum. In operation the transparent PBG anode electrode transmits the visible light emitted by the active layer in response to the first and second voltages being respectively applied to the cathode and anode electrodes.

Further features and advantages of the present invention, as well as the structure and operation of various embodiments of the present invention, are described in detail below with reference to the accompanying drawings.

BRIEF DESCRIPTION OF THE DRAWINGS

The present invention is described with reference to the accompanying drawings. In the drawings, like reference numbers indicate identical or functionally similar elements. Additionally, the left-most digit(s) of a reference number identifies the drawing in which the reference number first appears.

DETAILED DESCRIPTION OF THE PREFERRED EMBODIMENTS

I. Photonic Band Gap (PBG) Structures
 A. An Example PBG Structure
 B. Transmission and Reflection Properties of Metallic Structures
 C. Transparent Metal PBG Structures
 D. Experimental Results of a Transparent Metal PBG Photonic Device
II. Liquid Crystal Displays (LCDs) with PBG Transparent Electrode Structures
 A. A Basic LCD Device
 B. An Active Matrix LCD Device
 C. A Passive Matrix LCD Device
 D. Conclusion
III. Light Emitting Structures
 A. Prior Art Light Emitting Diode
 B. Light Emitting Structures with PBG Transparent Metal Electrode In the present invention, a transparent, multilayered electrode, or transparent metal stack, exhibiting a photonic band gap structure that transmits a visible range of wavelengths and suppresses a non-visible range of wavelengths of the electromagnetic spectrum, replaces a conventional transparent electrode made of a transparent semiconductor/metal-oxide, such as ITO, in an LCD device. Since an LCD device of the present invention uses a PBG structure as the transparent electrode, such PBG structures are now described in detail immediately below with reference to FIGS. 1–11. Then, exemplary LCD devices of the present invention using such described PBG structures as display electrodes are described with reference to FIGS. 12–18.

I. Photonic Band Gap (PBG) Structures
 A. An Example PBG Structure

The PBG structure used as a display electrode in the LCD device of the present invention is a transparent metallic structure that possesses the properties of a transparent glass in the visible portion of the electromagnetic spectrum, yet is opaque for all longer wavelengths (or smaller frequencies) from infrared light to radio waves. The structure is a transparent metallo-dielectric structure achievable using a photonic band gap structure.

Figure 1:
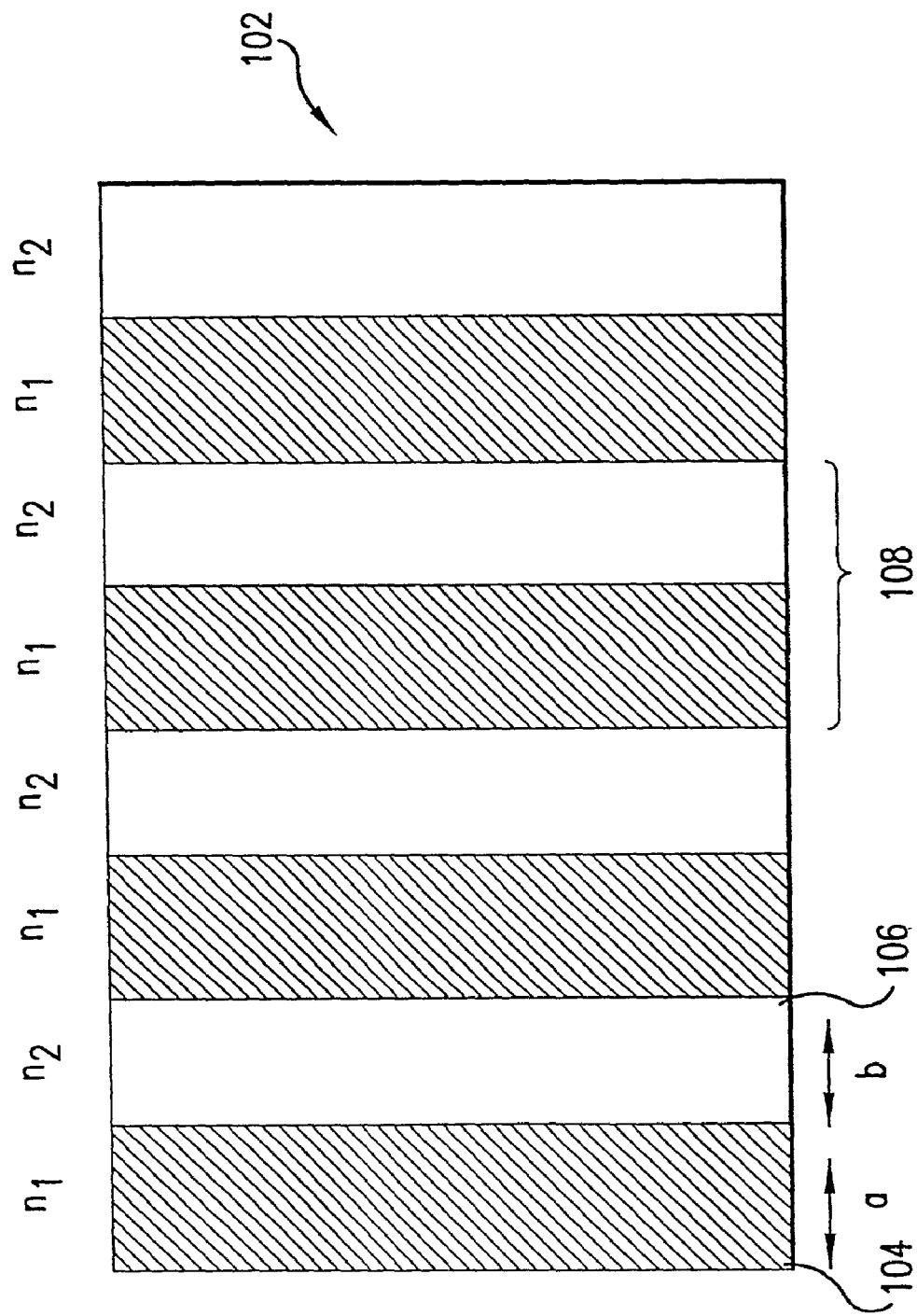
FIG. 1 is a schematic diagram of an exemplary PBG structure. The indices of refraction are $n_1$ and $n_2$ for each consecutive layer, with respective widths a and b. Each period is formed by the combination of two consecutive layers, and has width d=a+b.

A schematic illustration of an example PBG structure 102 is shown in FIG. 1. In one dimension, a PBG material is typically composed of a plurality of layers, whereby such plurality of layers alternates between a low and a high index of refraction. Each layer has a fixed index of refraction for low power incident photonic signals. For example, a first layer 104 can be chosen such that it is a high index layer. Next, a second layer 106 can be chosen to be a low index layer. One set of first and second layers is referred to as a period, such as period 108.

The widths of the first layer 104 and second layer 106 can also be chosen such that they are both a fraction of the size of a reference wavelength. For example, each layer can be one quarter of the reference wavelength. Thus, in this example, layer 104 can have a width (or thickness) (a), where $a=\lambda/4n_1$ and where $\lambda$ is the in-air wavelength of an incident photonic signal. Likewise, layer 106 can have a thickness (b), where $b=\lambda/4n_2$. This particular structure is referred to as a quarter-wave stack. As a consequence of this arrangement of the dielectric layers, light interference effects can cause some wavelengths of light to be transmitted through the structure, while another range of wavelengths centered about the reference wavelength, often referred to as "band gap" wavelengths, are completely reflected.

Figure 2:
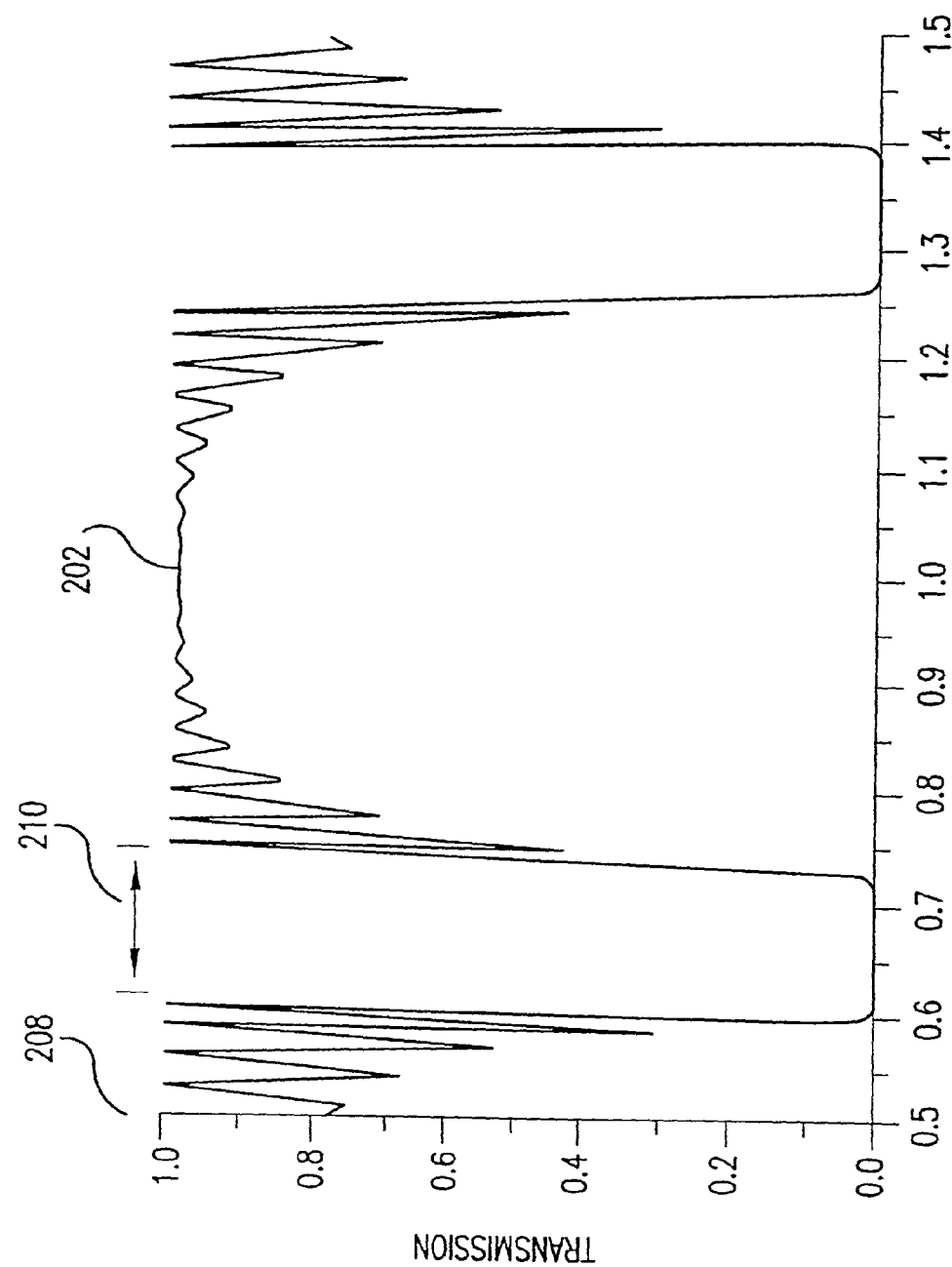
FIG. 2 is a transmittance vs. frequency profile for the exemplary PBG structure shown in FIG. 1.

FIG. 2 illustrates the transmissive properties of a similar example PBG structure. Transmission profile 202 is a plot of the transmission of light as a function of frequency from an example quarter-wave stack comprising 20 periods, or 40 alternating high/low index layers. A transmission of unity 208 corresponds to 100% of the photonic signal being transmitted. In this example, two dielectric materials are chosen. The first layer is a glass, with an index $n_1=1.41$. The second layer chosen is air, with an index $n_2=1$. By adjusting the width of the first and second layers, a shift of the location of the band gap to different wavelengths is created. This property provides significant flexibility in that a device can be designed to reflect a desired range of wavelengths, while providing for the transmission of other wavelengths.

Thus, a range of wavelengths about some reference wavelength cannot propagate inside this example device. On the other hand, this example PBG structure is transparent to other wavelengths, above and below the gap, such as gap 210 from FIG. 2. Therefore, it is the absence of those wavelengths from the transmitted photonic spectrum that gives rise to the name "band gap." Please note that this terminology is analogous to the electronic "band gap" described in semiconductors, where electrons having a specific range of energies cannot propagate through a semiconductor region. This analogy, however, is used for illustrative purposes only.

At wavelengths outside the photonic band gap, i.e., in a range above and below the band gap, a series of transmission resonances and gaps can be obtained, as depicted by transmission profile 202 of FIG. 2. The number of such resonances is equal to the number of periods that make up the structure. The width of these resonances and gaps is a function of the total number of periods, the indices $n_1$ and $n_2$, and the difference in index ($\delta n$), where $\delta n=|n_2-n_1|$, and is known as the index modulation depth.

The present invention is described in terms of this example structure. Description in these terms is provided for convenience only. It is not intended that the invention be limited to application in this example structure. In fact, after reading the following description, it will become apparent to a person skilled in the relevant art how to implement the invention in alternative environments. In the drawings, the thicknesses of layers and regions are exaggerated for clarity.

B. Transmission and Reflection Properties of Metallic Structures

Typically, the materials used in the fabrication of PBG structures, or integrated circuits in general, are either dielectric or semiconductor substances, due to their low absorption characteristics. The choice of materials can also be dictated by a specific need, material properties, or by available fabrication techniques. An overriding concern, however, is that the chosen materials should not absorb light to any significant extent, so as not to compromise device operation. For this reason, metallic substances are almost exclusively used to enhance the reflective properties of dielectric or semiconductor materials. Enhanced reflective properties are thus achieved by designing and incorporating within a particular dielectric or semiconductor device thick metallic films, such as silver, nickel, copper, aluminum or gold.

Theoretical calculations show that the reflectivity of metallic structures can be enhanced with respect to bulk metal if the metal is arranged to form a periodic structure. For example, a 256 aluminum/air periodic structure was designed so that the reflection from such a structure increased when compared to bulk aluminum from 96% to approximately 98% for a small range of frequencies. Each metal film was assumed to be approximately 2.5 nm in thickness. See "Photonic dispersion surfaces", A. J. Ward, et al., *Journal Physics Condens. Matter* 7:2217 (1995) (incorporated by reference herein in its entirety).

However, the properties of aluminum do not allow the fabrication of uniform films with such a small thickness (less than 2.5 nm thick). Even if such small thickness films could be realized with aluminum or other metals, such a structure would be opaque to electromagnetic waves of all wavelengths, as calculations show. Therefore, it is desirable to utilize thicker metal layers in a PBG structure for a variety of applications.

According to the present invention, a photonic device based on a PBG structure comprising thick or thin metal layers is provided. This transparent metal PBG device propagates light through these metal films and renders these structure transparent to visible light. This phenomenon is best explained through focusing specifically on the transmissive properties of PBG structures.

Structures that contain at most two silver layers, each about 10–15 nm in thickness, sandwiched between silver nitride layers, have been described. See, e.g., U.S. Pat. No. 5,557,462, to Hartig et al and U.S. Pat. No. 4,179,181 to Chang (each incorporated by reference herein in its entirety). However, these conventional structures still allow anywhere from 5% to 50% transmission of light energy in the infrared (IR) wavelength range and as much as 20% of near UV radiation (320–400 nm). For example, screening IR light from the sun corresponds to reflecting wavelengths between 750 and 2500 nm, where most of the infrared solar emission is found. See, *University Astronomy*, J. M. Pasackoff and M. L. Kutner, W. D. Saunders Company, 1978, especially Chapter 8 (incorporated by reference herein). Consequently, since heat energy is reflected, any enclosed environment will tend to remain cooler longer than usual, even if exposure to sunlight persists. Hence, the present invention can be incorporated into coating processes designed to significantly lower cooling costs.

Additionally, tunable transmission bands with transmissive and reflective properties that resemble those of a good metal shields are desirable for a wide range of frequencies. According to the present invention, these types of transmission bands can be generated in structures comprising more than two silver layers. The conventional thought in this area, however, is that either an increase in thickness, or the presence of additional metal layers, can drastically reduce the transmission of visible light.

According to the present invention, the transmission of light at visible wavelengths does not change appreciably, and can be controlled effectively with a metallo-dielectric, periodic structure comprising more than two silver layers. Further, the reflective properties of the resulting transparent metal PBG structure can be as good as those found in metal shields for very low frequency (VLF, 1000 to 15000 Hz) and extremely low frequency (ELF, zero to 1000 Hz) radiation, present near high-power lines, and to some extent, near appliances and television sets.

It is well understood that light can actually propagate a small distance inside metals before it is mostly reflected. A small amount of light, on the order of 1% or less, is absorbed, and reappears as heat given off by the metal. This characteristic length depends on the wavelength of the incident light, and it is referred to as "skin depth". The "skin depth" is arbitrarily defined as the distance at which the value of the field has decreased to approximately 37% of the field value at the input surface of the metal. See *Classical Electromagnetic Radiation*, by J. B. Marion, Academic Press, 1965 (incorporated by reference herein in its entirety).

For example, the skin depth of metals such as aluminum, silver, or gold is between 4 and 10 nm at visible wavelengths (where the wavelengths of visible light comprise the range of approximately 400–700 nm). On the other hand, the skin depth for a typical metal at microwave wavelengths can be tens of microns (typical microwave wavelengths can be on the order of centimeters and meters). This implies that externally incident waves will propagate approximately these respective distances inside the metal, depending on the incident wavelength, before being substantially reflected. Therefore, a metal film whose thickness is in excess of 10 or 15 nm is usually considered a thick film for visible light, while extremely thin for microwave radiation and radio waves.

The term "skin depth" described above is a useful concept as long as light is incident on uniform, highly reflective metal films that are more than 1 micron ($\mu$m) thick. However, the term "skin depth" loses its conventional meaning in the case of a periodic structure, where the presence of closely spaced boundaries, i.e., spatial discontinuities of the index of refraction, alters the physical properties of the structure as a whole. Some of these properties include modification of the effective speed of light, suppression of absorption, and transmission and reflection coefficients.

C. Transparent Metal PBG Structures

The display electrode of the present invention is based on metallic PBG structures. In the preferred embodiment, a PBG device (that is, electrode) includes a plurality of alternating material layers. The first material component is a transition metal. For example, this metal can be gold, silver, copper, aluminum, tungsten, bismuth, or in general a good conductor of electricity with properties similar to those of gold, silver, copper, etc. The second material component is a dielectric or semiconductor material. For example, glasses such as quartz or magnesium fluoride ($MgF_2$) can be used, and semiconductors such as gallium arsenide, aluminum arsenide, or germanium can also be used. Further, any alloy or other material that can be combined with a metallic substance can also be engineered and used for this purpose. This combination of materials results in a new index of refraction and new absorption characteristics for the PBG structure. These properties can depend on the respective proportions of the materials used in the structure. It should be noted, however, that similar structures that use different metals can respond to the same photonic signal in very different ways. Also, the ordering of the metal/dielectric structure can be interchanged to a dielectric/metal structure without affecting the transmissive properties of the PBG structure.

As an example to illustrate the preferred embodiment of the present invention and its operation, a transparent metal PBG structure can be fabricated with the component layers of silver (Ag), a metal, and magnesium fluoride ($MgF_2$), a glass. Here, the total amount of Ag in the transparent metal PBG device can be hundreds of skin depths in thickness. Similarly, the thickness of the $MgF_2$ layers can also vary. In particular, the transparent metal shielding device is a PBG structure comprising several alternating Ag/$MgF_2$ layers deposited on a glass, or any other suitable substrate.

Calculations to determine the theoretical transmission properties of the device can be performed using matrix transfer method and beam propagation method mathematical models. See, e.g., *Modern Optics*, by G. R. Fowles, Dover Publications, second edition (1975), and "A Beam Propagation Method that Handles Reflections", M. Scalora and M. E. Crenshaw, *Optics Communications* 108:191 (1994) (each incorporated by reference herein in its entirety).

The theoretical transmission properties of such a Ag/$MgF_2$ structure can be calculated as a function of wavelength (or frequency), as a function of the number of layers and/or layer thickness, and the incident angle of the input light beam. For purposes of the present invention, calculations were performed assuming an example glass substrate, whose index of refraction is approximately 1.5 for a wide range of incident wavelengths. It is well understood that the index of refraction of nearly all substances depends on the wavelength of the incident light. This physical principle is referred to as material dispersion, which can vary from substance to substance. For purposes of the present invention, the substrate functions to hold the metal/dielectric layers in place, and its exact physical properties can vary.

According to the present invention, a transparent metal PBG device can comprise a plurality of metal layers as thin as 10 nm (or thinner, as long as the properties of the layer are smooth and uniform throughout) and as thick as 50 nm or greater. These thickness values are intended as practical illustrations and are not intended to limit the present invention. In practice, this lower limit depends on available techniques that allow the metal film to be uniformly deposited on a substrate. The upper limit of the individual layer thickness can be dictated by a specific need. While 50 nm appears to be a reasonable upper limit in terms of most applications, some applications, such as arc welding, can require a metal layer thickness of greater than 100 nm.

Figure 3:
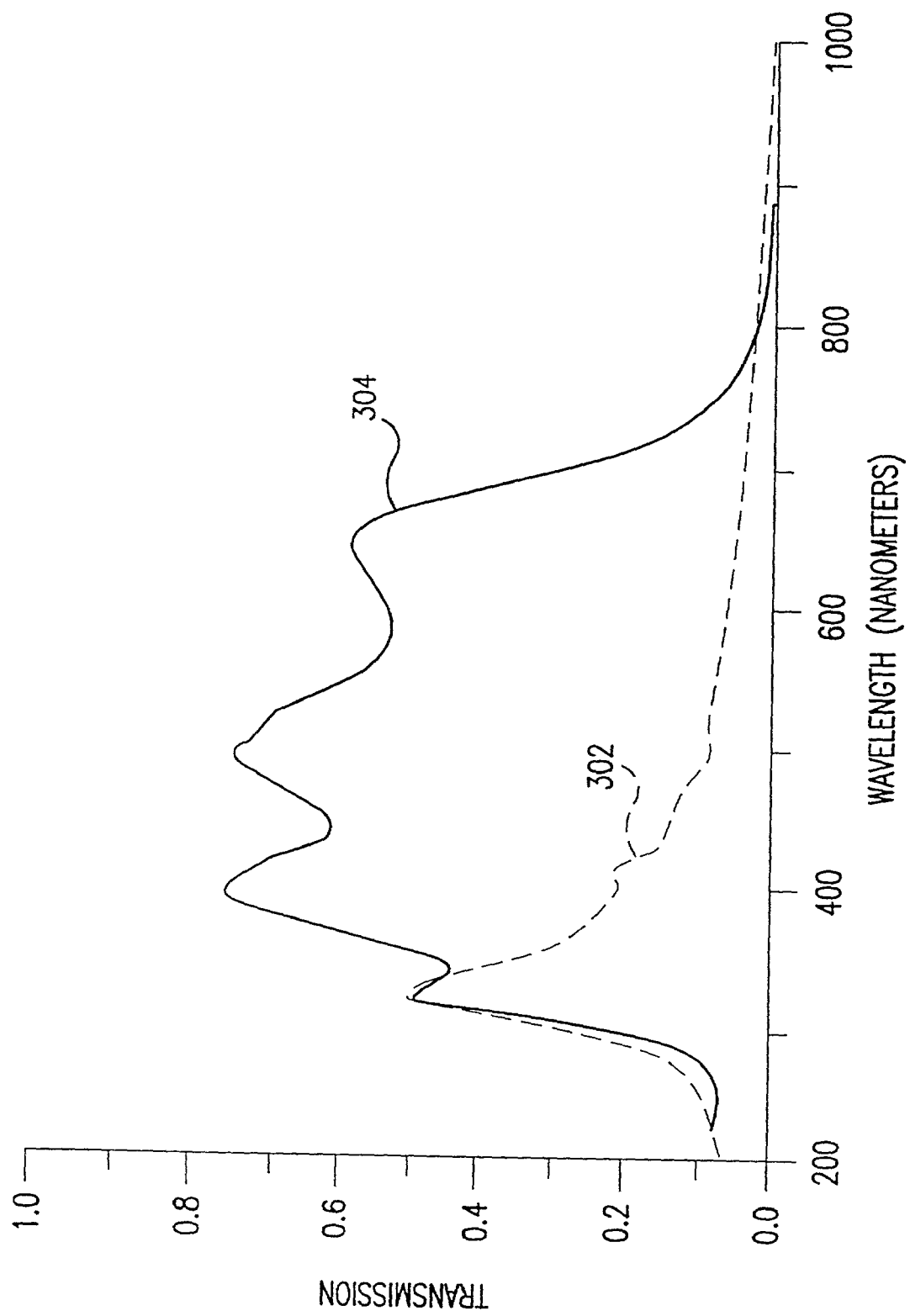
FIG. 3 is a transmission vs. wavelength profile for a 4-period PBG sample (solid line), where the silver (Ag) layers are 10 nm thick and the magnesium fluoride layers are 110 nm thick, and a solid silver film 40 nm thick (dotted line), in accordance with an embodiment of the present invention.

The present invention allows a user to determine a transmission profile based on a total metal thickness. A user can slice this total metal thickness into any number of individual metal layers in order to achieve the desired transmission window. For example, calculations show that a single Ag layer 40 nm in thickness suspended in air transmits 2.5% of the incident red light, 8% of green light, and about 15% of blue light. This transmission profile is illustrated in FIG. 3, dotted line 302. Thus, this example film is essentially opaque to visible light. However, if the original 40 nm Ag film is sliced into four Ag layers, each approximately 10 nm in thickness and spaced apart by approximately 110 nm thick $MgF_2$ layers, then the total transmission of visible light (400–700 nm) increases to an average of 70%. This is shown in the solid line 304 of FIG. 3.

Figure 4:
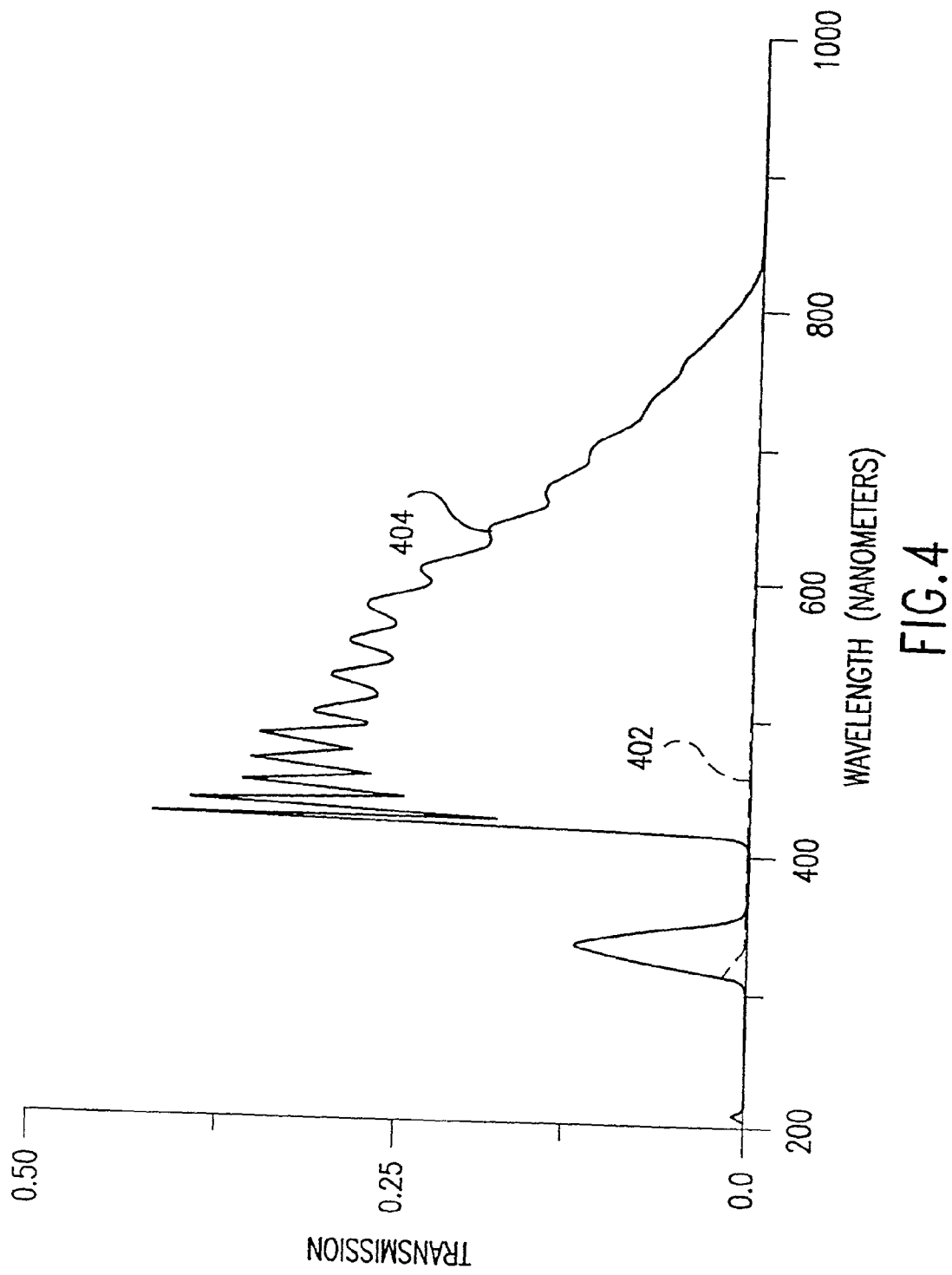
FIG. 4 is a transmission vs. wavelength profile for a 20-period PBG sample (solid line), where the silver layers are 10 nm thick and the magnesium fluoride layers are 140 nm thick, and the solid silver film is 200 nm thick (dotted line), in accordance with an embodiment of the present invention.

According to another example, a 200 nm thick Ag film is completely opaque to nearly all frequencies, allowing only $10^{-7}$ of the incident visible light to be transmitted. This is shown in FIG. 4, dotted line 402. On the other hand, if the original Ag film is sliced into 20 layers, each approximately 10 nm thick, and spaced apart by approximately 140 nm thick $MgF_2$ layers, then the average transmission in the visible range of frequencies increases to about 35%. This is shown in FIG. 4, solid line 404. The significant improvement in transmission for the multiple Ag/$MgF_2$ layer PBG structure is approximately seven orders of magnitude greater than for the single 200 nm Ag film structure. At the same time, the periodicity of the multiple Ag/$MgF_2$ layer structure described above also ensures better suppression of the transmitted light in the ultraviolet (UV) wavelength range (200–400 nm).

Generally speaking, adding more Ag/$MgF_2$ periods to the PBG structure causes a decrease in the transmitted light intensity. In addition, adding more Ag/$MgF_2$ periods can suppress the transmission of all lower frequencies and a good portion of the UV range. For example, a 40-period Ag/$MgF_2$ structure, where each Ag layer is 10 nm thick and each $MgF_2$ layer is approximately 200 nm thick, causes the average transmission of the device in the visible range to decrease to approximately 10%. At the same time, the transmission at all lower frequencies beginning in the near infrared (NIR) (at approximately 800 nm) is reduced to levels well below $10^{-20}$. This value represents an extremely high degree of isolation, with essentially zero transmission in the NIR. Please note that reducing the number of periods to 20, and doubling the thickness of the Ag layers to approximately 20 nm each yields approximately the same results. Furthermore, even fewer, but thicker Ag layers can be used to achieve approximately the same effect, thus adding flexibility to the design of a device for a specific purpose. As described in detail below, PBG structures can be fabricated that contain three periods, but where the metal layer thickness is approximately 30 nm. As is shown in FIG. 3, at visible wavelengths, a 30 nm thickness is considered a very thick metal film. Therefore, it would be ordinarily considered counterintuitive to add even more metal layers in order to improve the transmissive properties of the resulting structure.

Figure 5:
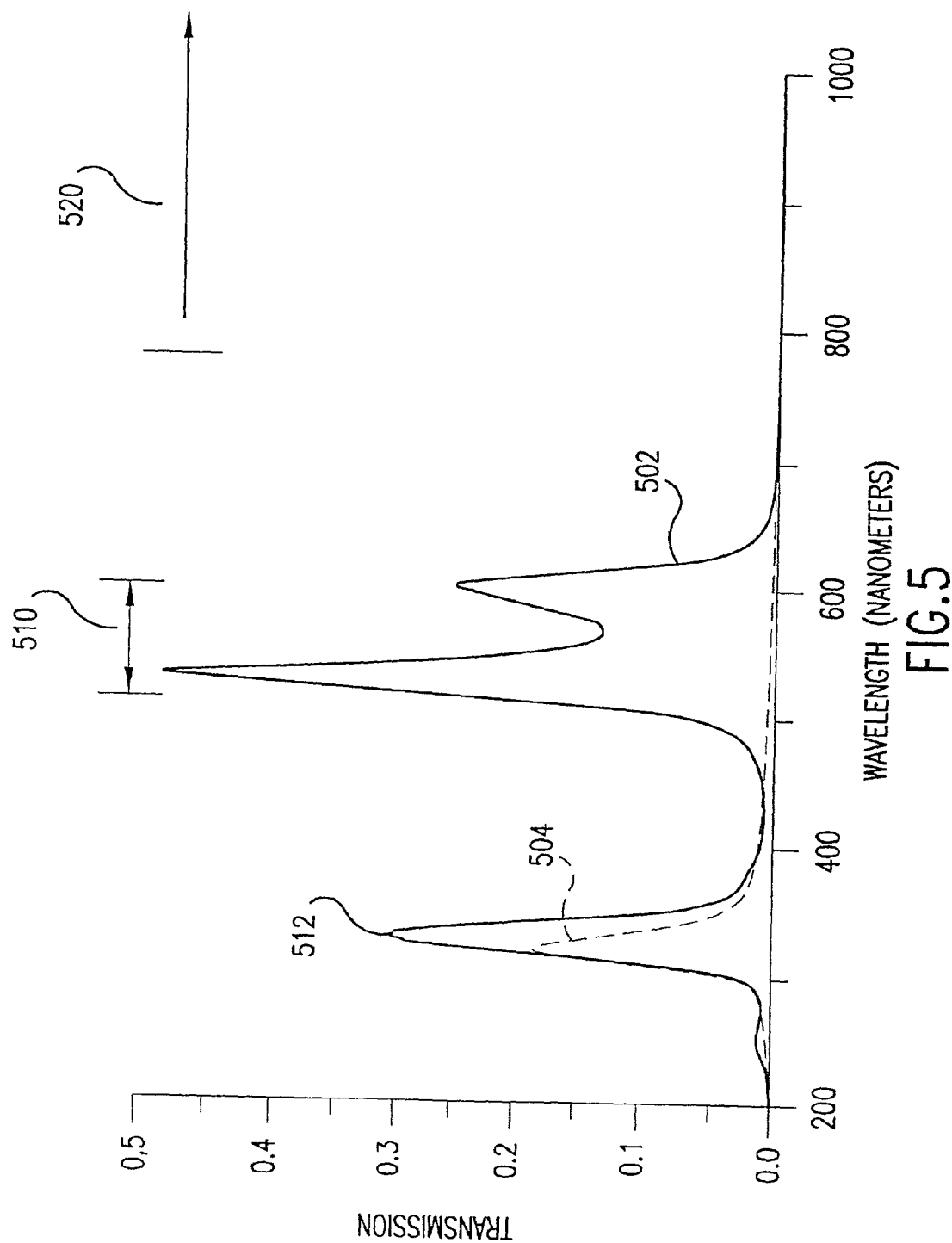
FIG. 5 is a transmission vs. wavelength profile for a silver/magnesium fluoride PBG sample (solid line), in accordance with an embodiment of the present invention, and the continuous silver film (dotted line), which are both shown schematically in FIGS. 6A and 6B.

FIG. 5 displays two transmission profiles. The solid line 502 represents the results of a theoretical calculation for the transmission of light as a function of incident wavelength from a PBG structure that comprises a glass substrate and a three period, Ag/$MgF_2$ PBG structure. Each Ag layer is approximately 30 nm thick, and each $MgF_2$ layer is approximately 150 nm in thickness. A schematic representation of this transparent metal PBG structure in shown FIG. 6A.

As a comparison, the transmission from a single layer, solid 90 nm Ag film is shown as the dotted line 504 in FIG. 5. A schematic representation of this PBG structure 650 in shown FIG. 6B. Thus, PBG structure 650 comprises the same total amount of silver as in the PBG structure 602 from FIG. 6A.

Further, FIG. 5 shows that the transmission from the solid metal film (dotted line 504) is approximately $10^{-3}$ in the visible range of wavelengths (from 400 to 700 nm). This transmission value is equivalent to approximately 30 decibels (dBs) of suppression in the transmitted light (where a factor of 10 change in transmission is equivalent to 10 dB of isolation). On the other hand, the maximum transmission (region 510) from solid line 502 (of the periodic PBG structure 602) is nearly 50% of the incident radiation, or four orders of magnitude greater compared to the solid Ag film 650. This maximum transmission is characterized by a peak in the green region (around 520 nm). Overall, this maximum transmissive range 510 extends over a substantial portion of the visible wavelength region.

A further transmission resonance 512 appears at approximately 320 nm, in the ultraviolet (UV) wavelength range. This UV transmission peak 512, however, is not due to the periodicity of the PBG structure 602, since it can be identified for both samples 602 and 650. The UV transmission peak 512 results from an inherent property of Ag, which becomes slightly transparent to UV radiation. This characteristic transparency disappears in either case, if the thickness of the metal film is further increased. For example, the ultraviolet transparency region is not present when gold and/or copper are used in a PBG structure, such as PBG structure 602, described above.

At longer wavelengths (region 520) beyond the visible range, the calculated transmission of light from the PBG structure is approximately $10^{-5}$ of its incident values, or 50 dBs of isolation. This behavior persists in the limit of infinite wavelength, or zero frequency.

Figure 7:
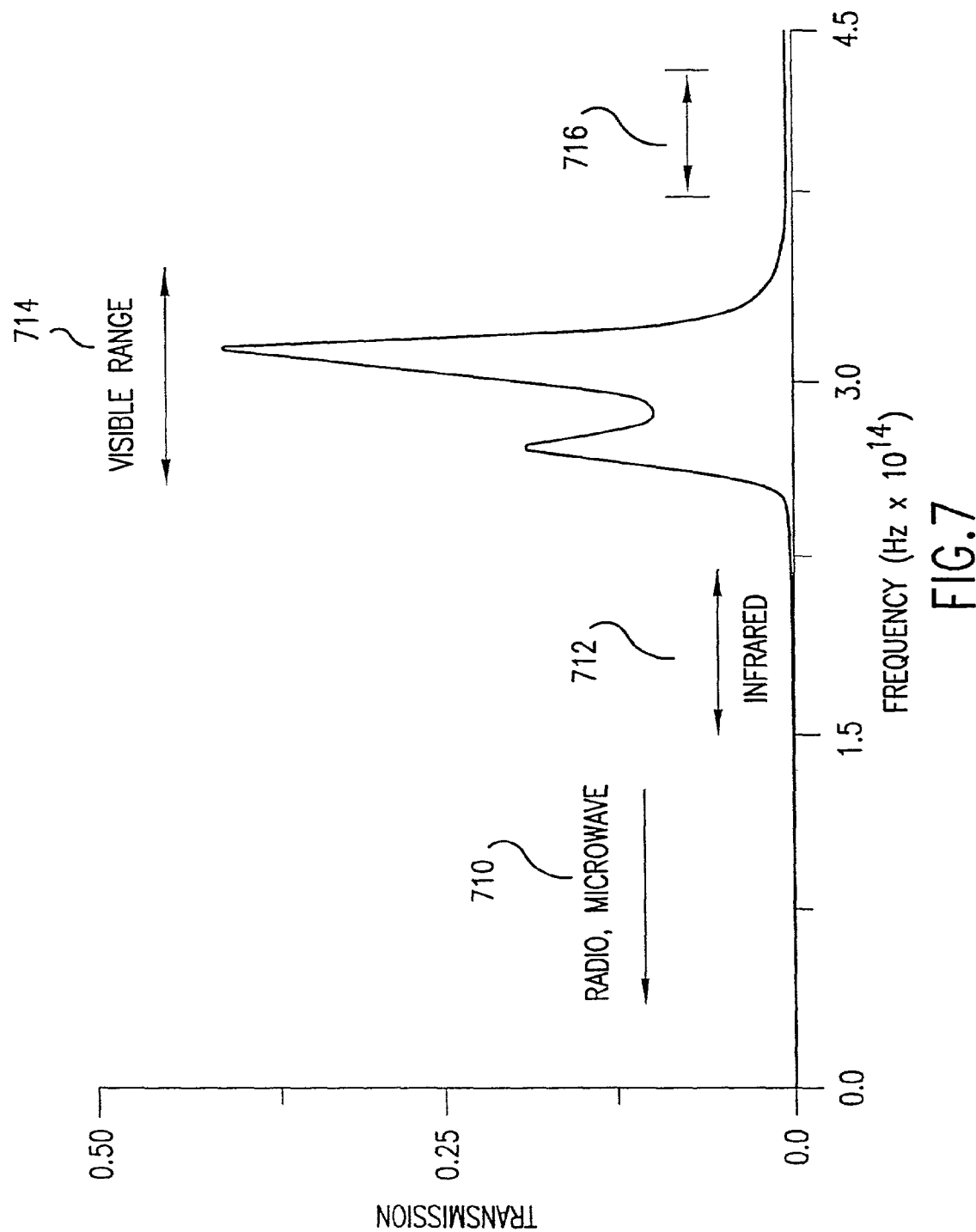
FIG. 7 is a transmission vs. frequency profile for a three-period PBG structure based on a Drude model calculation, in accordance with an embodiment of the present invention.

FIG. 7 displays the results of a calculation of the transmission versus frequency for the metal PBG structure 602 modeled using the dielectric constant derived from a Drude model calculation. See *Classical Electromagnetic Radiation,* by J. B. Marion, Academic Press, 1965. Briefly, the Drude model is an extension of the classical theory of electrons for metals. It provides an accurate theoretical representation of the dielectric constant (or index of refraction and absorption characteristics) for most metals, including silver, for a range that includes low-frequency radio waves and high-frequency ultraviolet light.

FIG. 7 shows that the transmission of light is suppressed for all frequencies 710 and 712 up to the visible range 714, where a maximum of approximately 50% is transmitted through the PBG device 602. In addition, a band gap characterizes a good portion of the UV frequency range 716, which as a result is also suppressed, as shown in FIG. 7. The small-frequency range depicted in FIG. 7 includes all communication frequency bands, microwave, and IR light. The calculation represented by FIG. 7 also suggests that in the limit of zero-frequency, i.e., ELF and VLF radiation, the transmission is suppressed down to levels better than 1 part in 10,000 of the incident photonic signal intensity values. Therefore, FIG. 7 represent the theoretical realization of what is referred to as a "transparent metal structure": it is transparent in the visible range, it functions as a good metal reflector at lower frequencies, and it suppresses UV light to a substantial degree.

This preferred embodiment of a transparent metal PBG structure, such as PBG structure 602, can also be fabricated using alternative material layers. Additionally, many different metals and dielectric or semiconductor thicknesses can be used as well. For example, by keeping the total silver thickness constant at about 90 nm, the transmission through the transparent metal structure can improve to an average of 60% with a total of eighteen layers; i.e., nine metal layers each 10 nm in thickness, and nine $MgF_2$ layers each 140 nm in thickness. This improvement in transmission suggests that by modifying each metal layer and each $MgF_2$ layer independently, the transmission can be even further optimized.

Figure 8:
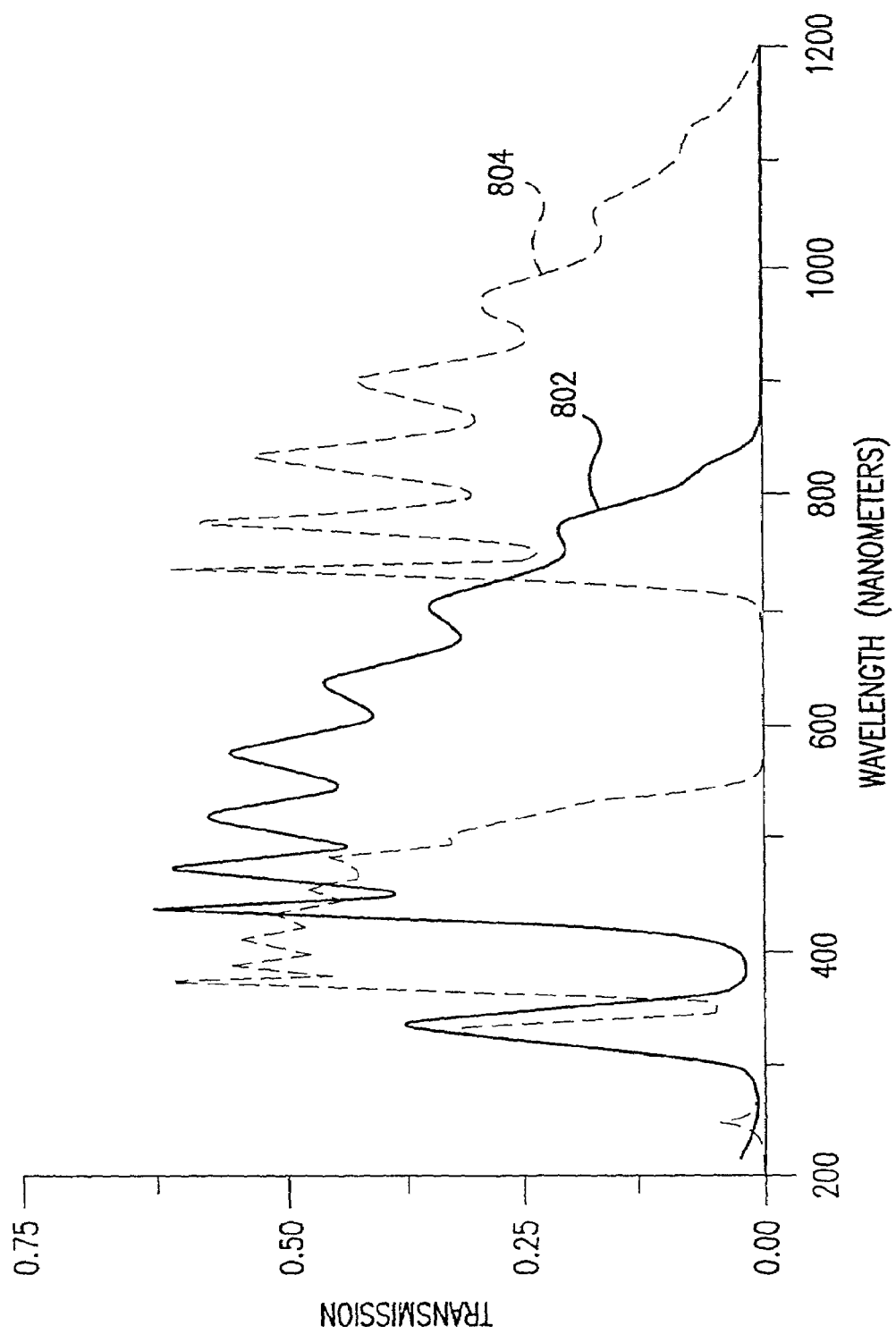
FIG. 8 is a transmission vs. wavelength profile for a nine-period, silver/magnesium fluoride PBG structure, where the silver layers are 10 nm thick and the magnesium fluoride layers are 140 nm thick (solid line), and where the silver layers are 10 nm thick and the magnesium fluoride layers are 250 nm thick (dotted line), in accordance with an embodiment of the present invention.

FIG. 8 (solid line 802) is a representation of the transmission for the eighteen layer structure described above. In addition to controlling the magnitude of suppression of certain wavelengths of light, the present invention also provides for the control of the wavelength range where light is transmitted. This wavelength range control is accomplished by either increasing or decreasing the thickness of the $MgF_2$ layers, and by altering the thickness of the metal layers to a lesser degree. For example, FIG. 8 shows an example of this change in transmission profile. Solid line 802 represents an eighteen layer structure, where each Ag layer is 10 nm thick, and each $MgF_2$ layer is 140 nm thick. Dotted line 804 represents the transmission of a similar eighteen layer, where each Ag is 10 nm thick, but where each $MgF_2$ layer is approximately 250 nm in thickness. Thus, as illustrated in FIG. 8, more uniform transmission in the visible range can be achieved when one of the higher order pass bands is tuned to the visible wavelength range. The desired transmission profile is accomplished by utilizing thicker interstitial (dielectric or semiconductor) layers. These transmission profiles 802 and 804 help illustrate the flexibility of the present invention.

According to the present invention, the thicknesses of either the metal layers or the dielectric (or semiconductor) layers can be chosen dependant upon the specific application. Cost can also be a driving factor in PBG device design. Transparent metal PBG devices with fewer periods are generally cheaper to manufacture, while the thickness of very thin metal films are more difficult to control. Further embodiments of the present invention can use a combination of two or more metals, and/or two or more types of dielectric or semiconductor materials within the same PBG structure, without any significant departure from the basic characteristics already described.

Thus, the present invention demonstrates that light can be transmitted through thin or thick, periodic, metallic structures. Additionally, the thickness of the dielectric or semiconductor sandwiched between the metal films can be controlled, as well as the thickness of each metal film, in order to tune the transparency regions of the transparent metal PBG device. Just as significantly, while the transparent metal PBG device exhibits a transparency window in the visible range of frequencies, all lower frequencies (or longer wavelengths), as well as a substantial portion of the UV range, are rejected by a substantial amount.

Further, the present invention encompasses several different methods of providing a tunable transparency window (or pass band). As mentioned above, controlling the wavelength range where light is transmitted can be accomplished by increasing or decreasing the thickness of the interstitial $MgF_2$ layers. Other methods of tuning the transparency window include adding more periods to the structure and applying an external electric field to the transparent metal PBG device. These tuning methods are described in detail below.

According to another embodiment of the present invention, it is possible to use dielectric or semiconductor materials as interstitial layers sandwiched between the metal layers such that their index of refraction is a sensitive function of an externally applied field. Modification of the index of refraction is equivalent to adjusting the optical path length of the layer. Therefore, the transparent wavelength range can be tuned (or moved on the wavelength axis) with the application of a static field, as for example, in the electro-optic effect, or by using piezoelectric elements to cause membranes which contain transparent metal stacks to vibrate, and thus change a spacing between the membranes, as in micro electromechanical systems (MEMS). Changing the spacing amounts to optically tuning the transmission window.

Further, the transparent window can be changed dynamically by a time-varying field that propagates through the transparent metal PBG structure for applications to optical limiting, switching, and optical diode behavior. For example, increasing the input intensity can cause increased reflections and drastically reduced transmission in the case of an optical limiter, and unidirectional propagation in the case of an optical diode.

D. Experimental Results of a Transparent Metal PBG Photonic Device

Figure 6A:
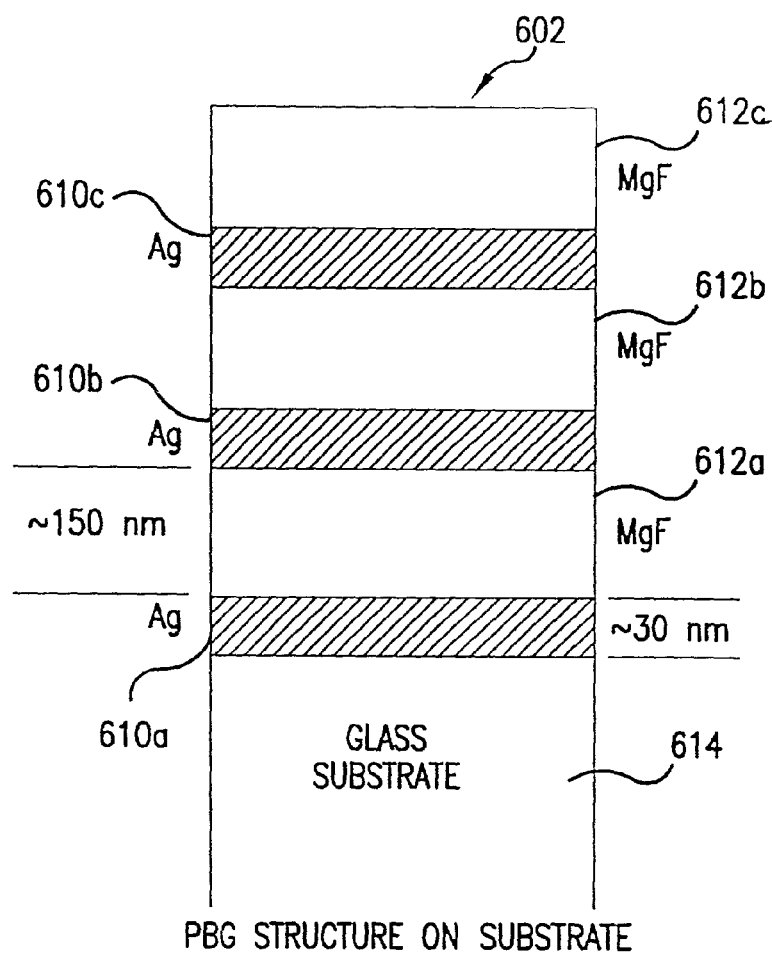
FIG. 6A is a schematic representation of a three-period PBG structure, in accordance with an embodiment of the present invention.
Figure 6B:
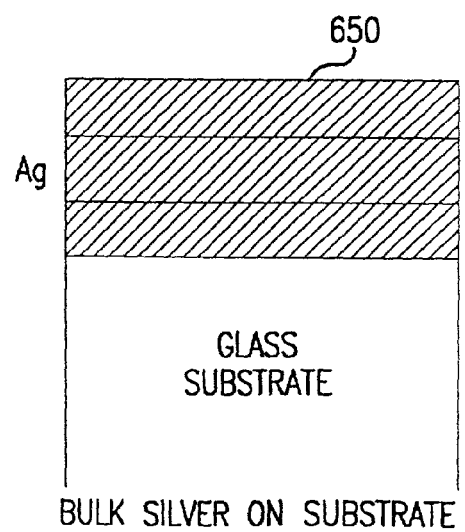
FIG. 6B is a schematic representation of a 90 nm thick silver film on a substrate.

Recall that FIG. 6A shows a schematic representation of a device 602 that is referred to as a "transparent metal PBG structure" according to the present invention. The transparent metal PBG device 602 receives a photonic signal of wavelength λ. The photonic signal is partially transmitted by the transparent metal PBG device 602 only if the wavelength λ is found within the ranges outside of the photonic band gaps, such as those depicted in FIG. 8 (described above).

Also recall that the transparent metal PBG device 602 of FIG. 6A is a PBG structure that includes a plurality of first and second alternating layers (also referred to as a multilayer stack). The layers alternate between silver layers 610a–610c, whose index of refraction has value $n_2$ that is a function of wavelength, and $MgF_2$ glass layers 612a–612c, whose index of refraction has value $n_1$, which is also a function of wavelength.

For example, a transparent metal PBG device similar to the device 602, from FIG. 6A described above, was fabricated and tested. The experimental device comprises: (1) a rectangular glass substrate (similar to substrate 614), about 5 cm long and 2.5 cm wide; (2) three Ag layers (similar to layers 610a–610c), each approximately 27.5 nm in thickness; and (3) two $MgF_2$ layers (similar to layers 612a–612b) each approximately 156 nm thick, in the order, Substrate/Ag/$MgF_2$/Ag/$MgF_2$/Ag.

The first Ag layer 610a was deposited by conventional vacuum evaporation techniques on substrate 614. In this example, a glass substrate 614 was used, whose index of refraction is 1.51. However, any other suitable substrates (such as plastics or other materials) can be used without affecting the fundamental transmission and reflection properties of the transparent metal PBG device 602. In addition, the experimental device was designed so that its transmission would be a maximum at green wavelengths (around 520 nm).

The second layer, $MgF_2$ layer 612a, was grown by conventional vacuum evaporation techniques on the first Ag layer 610a. The Ag and $MgF_2$ vacuum evaporation processes were repeated to add subsequent layers. For simplicity, the third and final $MgF_2$ layer 612c was omitted without affecting the overall properties of the transparent metal PBG device 602.

Moreover, a three-period structure was chosen as a preferred embodiment of the present invention because with fewer than three periods (or in this case, fewer than three metal layers) the band structure of the device is not well defined. For example, calculations were performed on a structure utilizing only two metal layers (i.e., a two period structure). Each metal layer can be greater than 50 nm thick in the two period structure, which still provides approximately 10 to 15 percent transmission in the visible range (i.e., less than 1 dB of suppression). This transmission magnitude is similar to what is found in conventional, tinted car windows. However, the resonance peaks created in the photonic band gap structure are not very broad. Calculations similar to those described above show that the band structure becomes well defined once a rudimentary periodicity (i.e., greater than two periods) is built into the PBG device. Additionally, the bandwidth of the pass band (i.e., the transparency region) tends to increase with the number of periods in the PBG device. Thus, while the two period structure can operate as a filter, according to the present invention, it is preferred to utilize more periods in order to control the transmission characteristics of PBG device.

Figure 9:
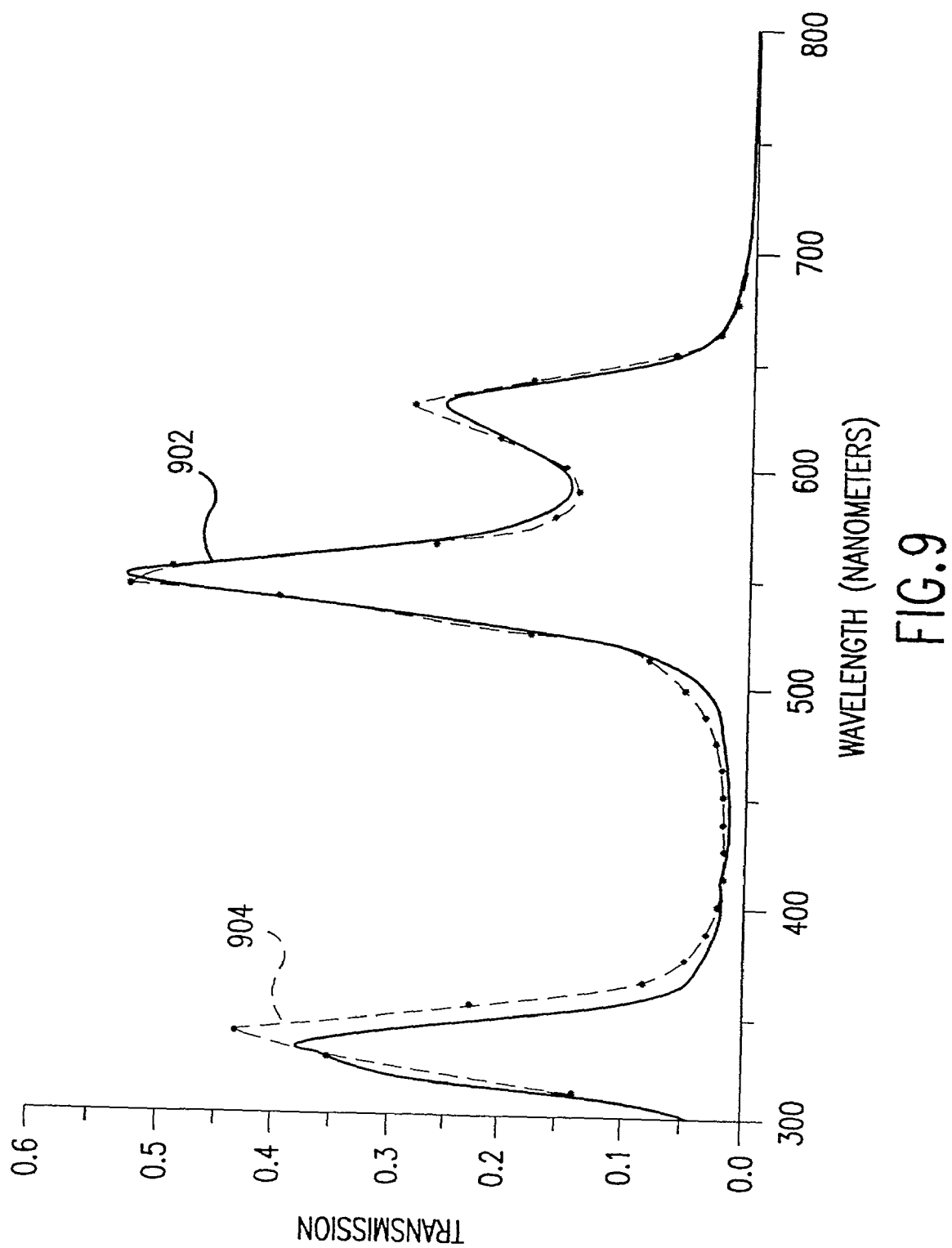
FIG. 9 is the theoretical (solid line) and experimental (dotted line) transmission vs. wavelength profile for the preferred embodiment of the present invention, a 3-silver layer, 2 magnesium fluoride layer, PBG structure.

The calculated theoretical transmission for this transparent metal PBG device 602 is shown in FIG. 9, solid line 902. Dotted line 904 represents the actual transmission for the experimental transparent metal PBG device 602, and is described further below.

The structure of transparent metal PBG device 602 can be modified to include thicker $MgF_2$ layers. For example, increasing the thickness of each inner $MgF_2$ layer to 200 nm causes the band structure of curves 902 and 904 of FIG. 9 to shift up in wavelength, in analogy to the example discussed in connection with FIG. 8. In addition, the maximum transmission can be further increased by at least 10% by adding a third and final $MgF_2$ layer 612c, with a thickness of 100 nm instead of 200 nm. Therefore, the overall transmission can be enhanced by changing the thickness of the individual layers comprising the transparent metal PBG device.

After the experimental transparent metal PBG device was fabricated, two tests were conducted. In the first test, photonic signals of wavelengths in the range between 300 and 900 nm were delivered to the transparent metal PBG device. The results of this experiment are shown in FIG. 9, dotted line 904. Some small disagreements between theory (solid line 902) and experiment (dotted line 904) can be identified in FIG. 9. However, this minor discrepancy is due to the uncertainty in material layer thickness that occurs in the evaporation chamber. Overall, the agreement between theory (solid line 902) and experiment (dotted line 904) is nevertheless extremely good. In this case, the error is approximately 1 to 5 percent. However, this error value is inherently due to the vacuum deposition process used to grow the PBG structure. This error can be reduced by refining the deposition technique (e.g., using an ion sputtering deposition technique).

A second test was conducted to verify that the experimental transparent metal PBG device was also a good reflector of microwave radiation, as predicted in FIG. 7. The second test employed a microwave transmitter and receiver that operated in the range 2 to 20 GHz (or $10^9$ Hz), which is a regime where the photonic signal wavelength varies from approximately 1 to 15 centimeters (cm). In particular, this test was conducted to compare the shielding abilities of a standard copper metal plate several millimeters in thickness with the experimental device. This comparison is shown in FIGS. 10 and 11.

Figure 10:
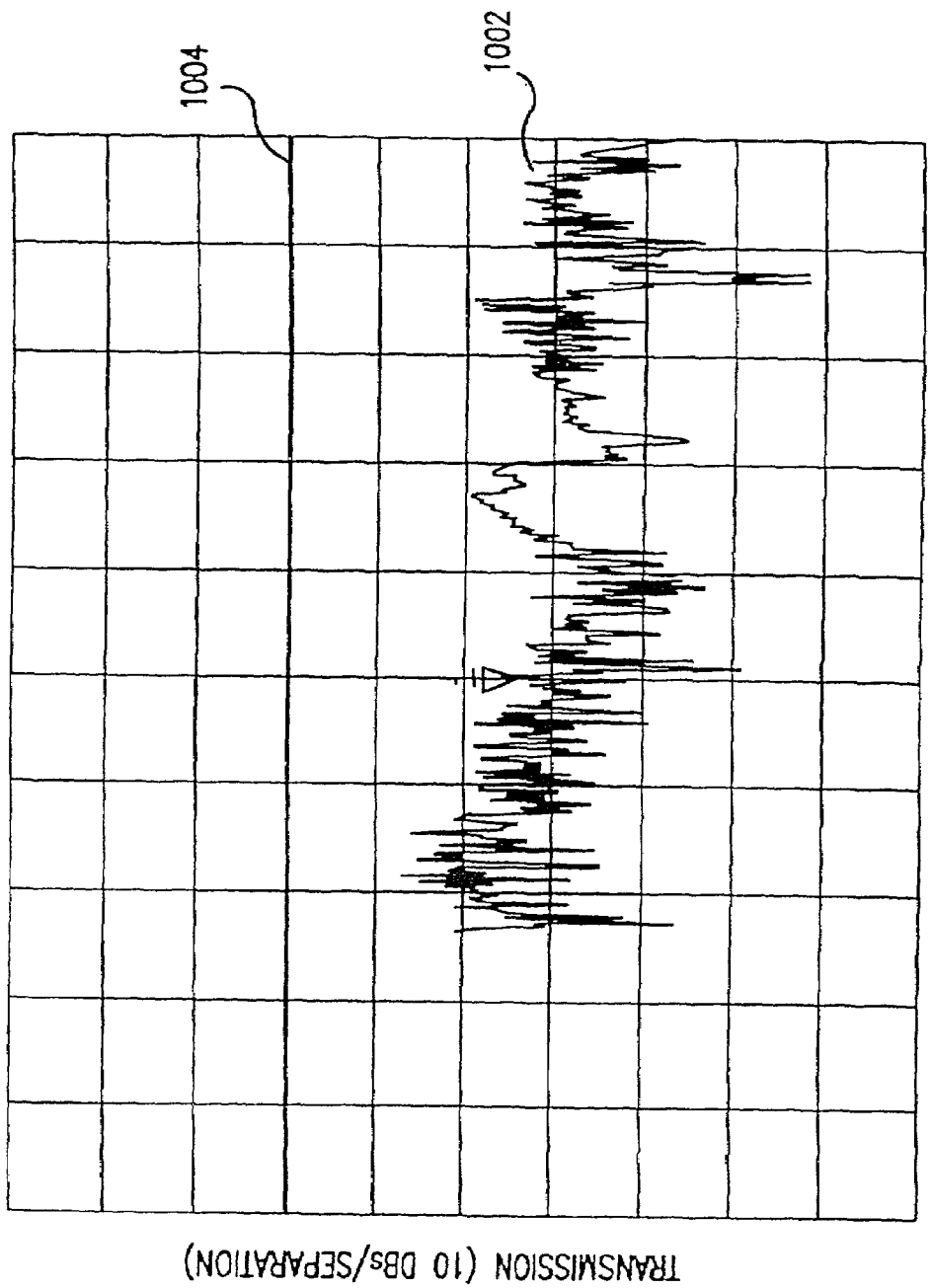
FIG. 10 is a transmission vs. frequency profile of an example copper plate at microwave wavelengths.

FIG. 10, signal 1002 shows the microwave response of the standard copper shield by plotting transmission versus frequency. Along the y-axis, each separation is equivalent to a drop of 10 dBs. The signal 1002 at the receiver is suppressed between 30 and 40 dBs with respect to free space reception for the range 2–20 GHz, which is indicated by the thick, horizontal line 1004.

Figure 11:
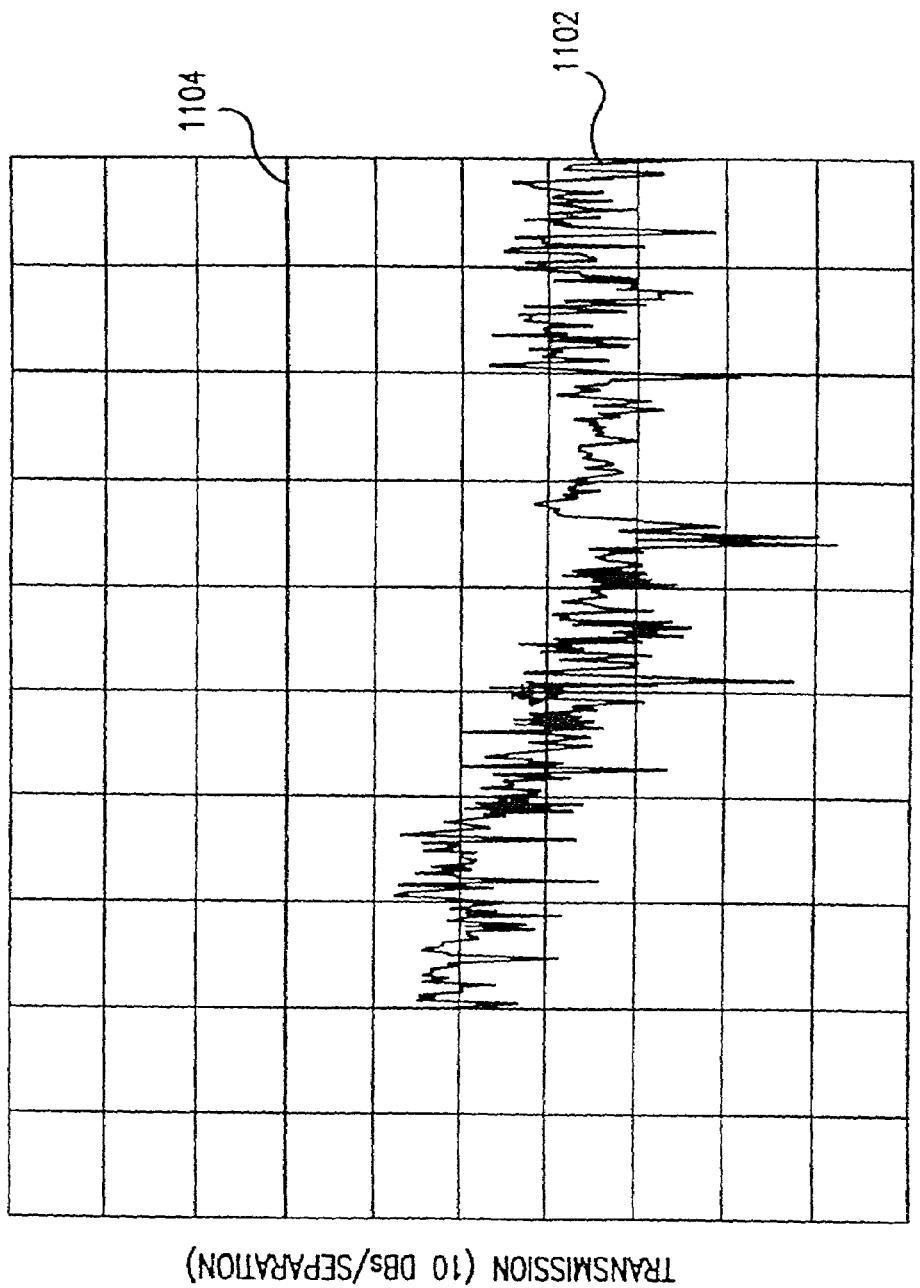
FIG. 11 is a transmission vs. frequency profile of a preferred PBG sample at microwave wavelengths, in accordance with an embodiment of the present invention.

Similarly, in FIG. 11, signal 1102 represents the microwave performance of the experimental transparent metal PBG device. Again, the free space reception for the range 2–20 GHz is indicated by the thick, horizontal line 1104. These results are in excellent agreement with the theoretical predictions presented in FIG. 7. Comparing FIGS. 10 and 11 illustrates that the suppression by the experimental PBG device at the receiver is at least as good as the metallic copper plate. Thus, this comparison verifies that the experimental PBG device is indeed a "transparent metal structure."

II. Liquid Crystal Displays (LCDs) with PBG Transparent Electrode Structures

The exemplary LCD devices of the present invention use the PBG structures (described above in connection with FIGS. 1–11) as transparent electrodes, as is fully described below with reference to FIGS. 12–18.

A. A Basic LCD Device

Figure 12:
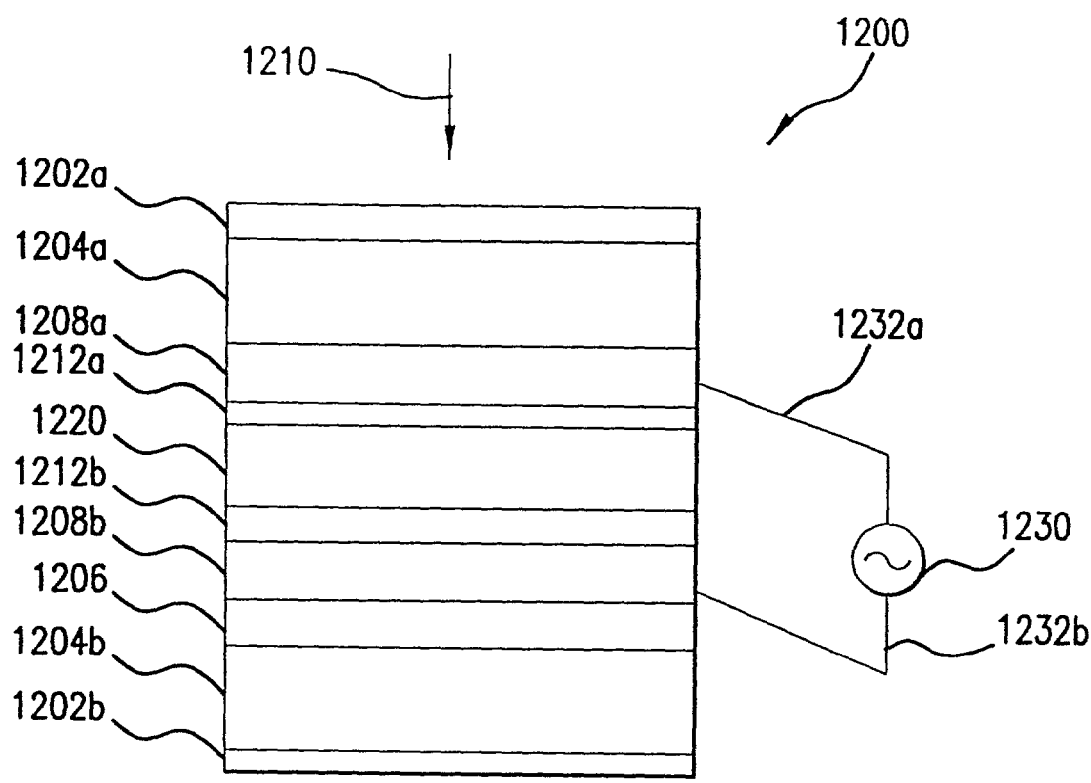
FIG. 12 is diagram of an embodiment of an LCD device having a transparent PBG electrode structure, in accordance with the present invention.

FIG. 12 is an embodiment of an LCD device 1200 using a transparent PBG electrode structure of the present invention. Device 1200 includes a conventional upper light polarizing layer 1202a and a conventional lower light polarizing layer 1202b spaced apart from each other. A conventional upper glass substrate 1204a and a conventional lower glass substrate 1204b are bonded to respective inner surfaces of upper and lower polarizing layers 1202a and 1202b. A conventional Blue-Green-Red color filter 1206 is bonded to an inner surface of lower glass substrate 1204b.

In accordance with the present invention, an upper PBG electrode layer 1208a and a lower PBG electrode layer 1208b are bonded to respective inner surfaces of glass substrate 1204a and color filter 1206. PBG electrode layers 1208a and 1208b are each constructed as transparent multi-layer stacks as described above in connection with FIGS. 1–11. PBG electrode layers 1208a and 1208b are transparent to visible light frequencies in a light beam 1210 directed at LCD device 1200 from a back light (not shown).

A conventional upper LC aligning or rubbing layer 1212a and a conventional lower aligning layer 1212b are bonded to respective inner surfaces of upper and lower PBG electrodes 1208a and 1208b. A conventional liquid crystal layer 1220 extends between aligning layers 1212a and 1212b. A signal source 1230 applies voltage signals to upper and lower PBG electrodes 1208a and 1208b via a pair of respective signal lines 1232a and 1232b coupled with the PBG electrode layers. A voltage applied across PBG electrodes 1208a and 1208b establishes an electric field across LC layer 1220 and thereby controls the LC molecule orientations throughout the LC layer, as is known. It should be appreciated that one of PBG electrodes 1208a or 1208b can be at a voltage level corresponding to a ground potential as necessary, according to the construction and type of LCD device.

Figure 13:
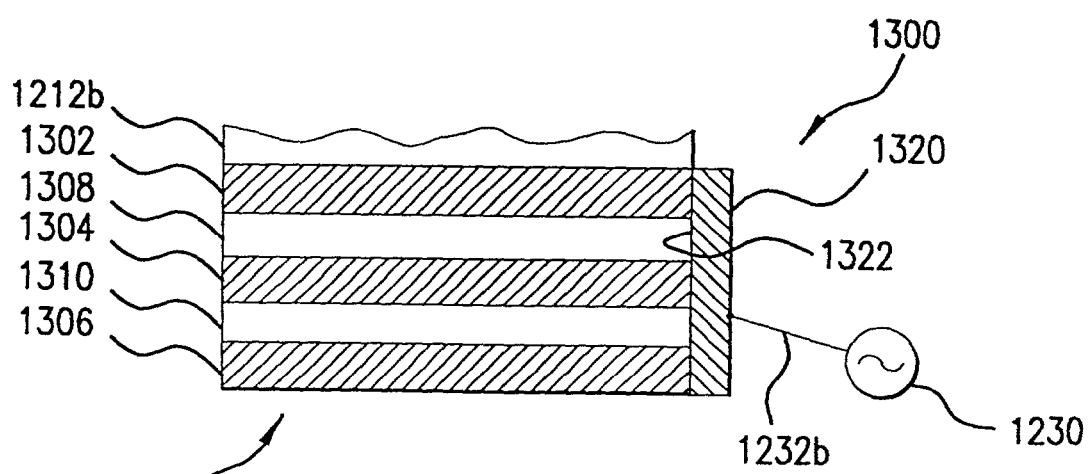
FIG. 13 is a diagram of an arrangement for connecting a transparent PBG electrode to a signal line in the LCD device of FIG. 12, in accordance with the present invention.

An arrangement 1300 for connecting lower electrode 1208b to respective signal line 1232b is depicted in FIG. 13. A similar arrangement is used to connect upper electrode 1232a to respective signal line 1232a. Lower PBG electrode 1208b, constructed as a transparent metal stack of the present invention, includes a plurality of alternating metal layers 1302, 1304, and 1306 and interstitial layers 1308 and 1310. The actual number of layers 1302–1310 varies according to a desired optical characteristic of metal stack 1208b, as discussed in connection with FIGS. 1–11. A conductive metal film 1320 deposited on a (right) side 1322 of metal stack 1208b provides electrical connectivity between metal layers 1302, 1304, and 1306. Thus, signal line 1232b, coupled directly to metal film 1320, applies a voltage to each of the metal layers in metal stack 1208b via metal film 1320.

Alternative signal line coupling arrangements are possible. For example, in a first alternative arrangement, metal film 1320 can be shortened to overlap only selected ones of the metal layers 1302–1306. In a second alternative arrangement, metal film 1320 can be omitted altogether, whereby signal line 1232b is connected directly to any one of metal layers 1302, 1304 or 1306. The second arrangement can be used when interstitial layers 1308 and 1310 are relatively poor insulators, whereby micro-channels form in the interstitial layers during fabrication of metal stack 1208b. The micro-channels effectively connect the metal layers 1302, 1304, and 1306 together so that applying a voltage to one of the metal layers effectively applies the same voltage to the other metal layers.

It is to be understood that LCD device 1200 is exemplary only and therefor not limiting with respect to the use of transparent PBG electrodes in many known types of LCD devices, generally. For example, the present invention applies to at least the following types of LCD devices:

1. Twisted Nematic (TN) LCDs, wherein an aligning direction of the LC molecules in the LC layer twists or rotates through an angle of 90° across the LC cell;

2. SuperTwisted Nematic (STN) LCDs, wherein the aligning direction of the LC molecules rotates through an angle of between 180° and 270° across the LC cell;

3. Double SuperTwisted Nematic (DSTN) LCDs, wherein two distinct STN LC cells are bonded together in a back-to-back configuration, one of the STN LC cells being used as a compensator, as is known;

4. Triple STN LCDs;

5. Film Compensated STN (FSTN) LCDs, wherein a plastic film replaces the compensator cell used in DSTN LCDs; and 6. Passive and active matrix LCDs, as are described below.

B. An Active Matrix LCD Device

Figure 14:
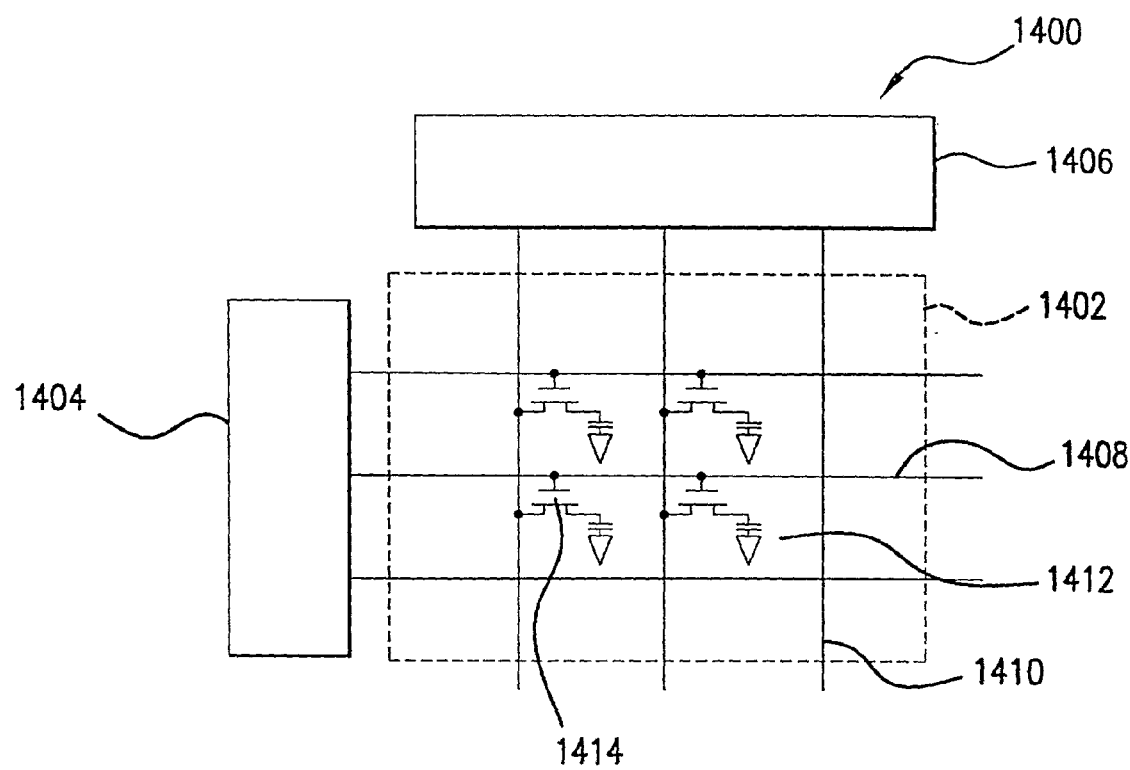
FIG. 14 is as diagram of an embodiment of an active matrix LCD display device system, in accordance with the present invention.

An embodiment of an active matrix LCD device of the present invention is now described with reference to FIGS. 14, 15 and 16. An active matrix LCD display device system 1400 is depicted in FIG. 14. LCD system 1400 includes a display region 1402, and both a data driver Integrated Circuit (IC) 1404 and a gate driver IC 1406 for generating image signals. A plurality of scanning (gate) lines 1408 coupled with and driven by data driver 1404, and a plurality of data lines 1410 coupled with and driven by gate driver IC 1406, and crossing gate lines 1408, form a matrix configuration within display region 1402. A transparent PBG pixel electrode 1412 of the present invention and a thin film transistor (TFT) 1414 are formed at each cross over portion between one of the scanning lines 1408 and one of the data lines 1410.

Figure 15:
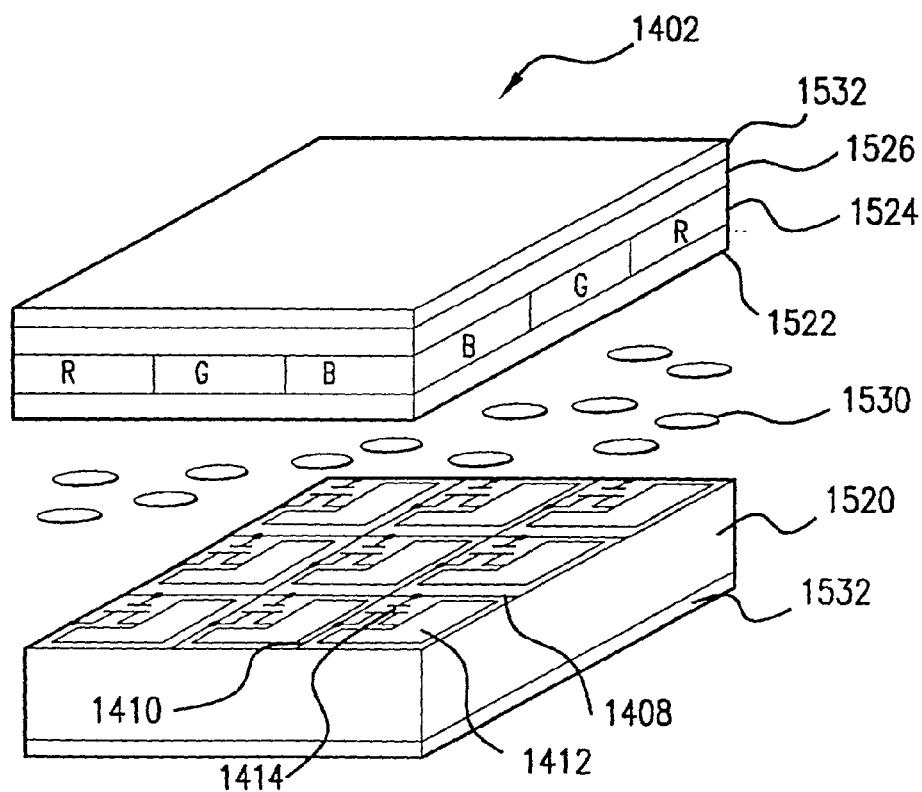
FIG. 15 is a diagram of a detailed structure of an LCD display region in the LCD system of FIG. 14, in accordance with the present invention.

An embodiment of a detailed structure of display region 1402 is depicted in FIG. 15. Display region 1402 includes scanning (gate) lines 1408 and data lines 1410, crossing the gate lines 1408, and formed in a matrix configuration on a first transparent substrate 1520. A common PBG electrode 1522 of the present invention and a color filter 1524 are formed on a second transparent substrate 1526 facing first substrate 1520. A conventional black matrix layer (not shown) can encircle individual color elements in color filter layer 1524 in a known manner. A liquid crystal layer 1530 occupies a volume defined between first and second transparent substrates 1520 and 1526. The common PBG electrode 1522 and each PBG pixel electrode 1412 spaced apart from the common electrode by the liquid crystal layer 1530, form a matrix of pixels of the LCD. Polarizers 1532 formed on the outer surfaces of the first and second substrates 1520 and 1526, selectively transmit light depending on the arrangement of the liquid crystal layer 1530.

Figure 16:
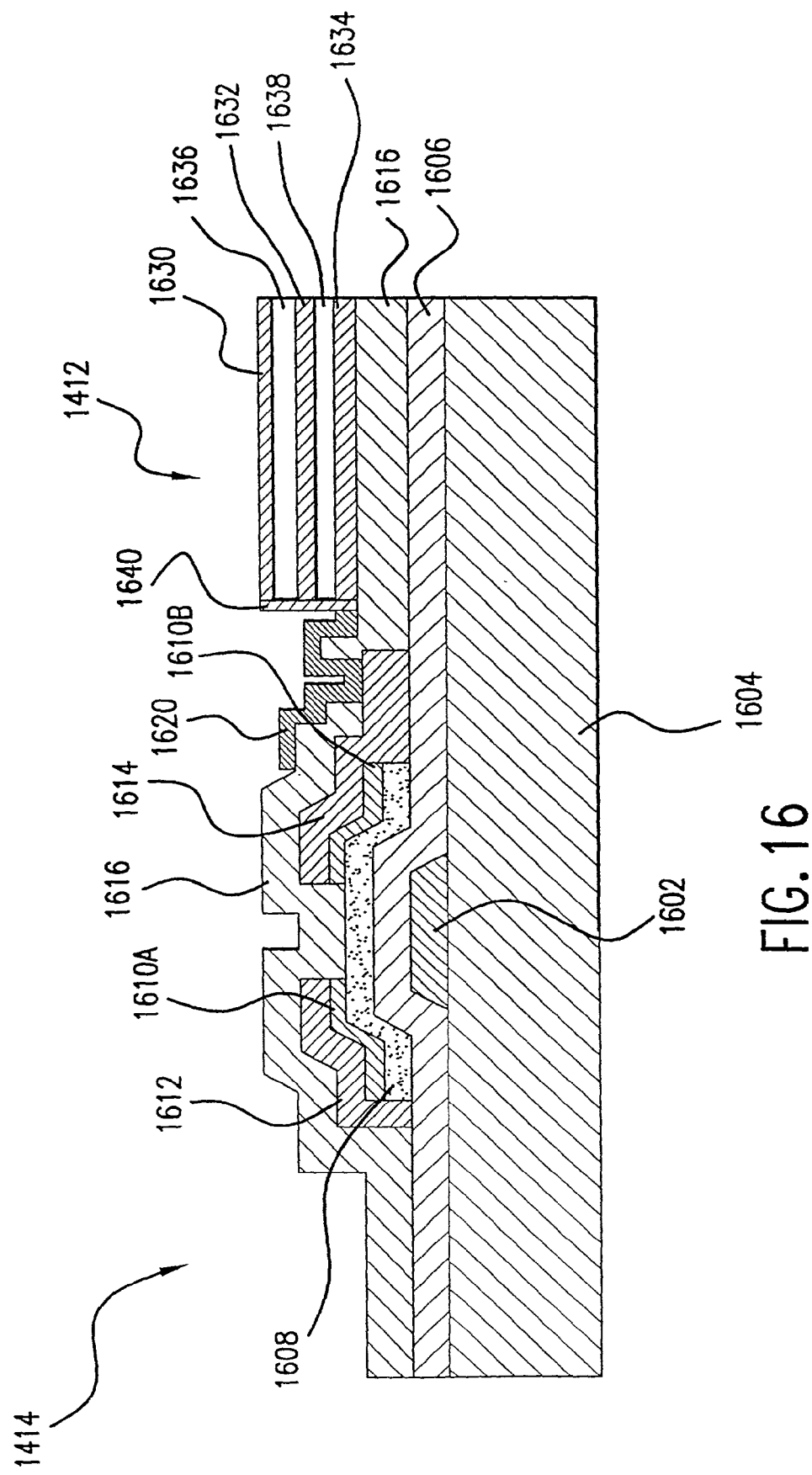
FIG. 16 is a diagram of a structural arrangement of a Thin Film Transistor (TFT) and a PBG pixel electrode used in the LCD display region of FIG. 15, in accordance with the present invention.

A structural arrangement of conventional TFT 1414 and a PBG pixel electrode 1412 coupled thereto, are depicted in FIG. 16. TFT 1414 includes a gate electrode 1602 formed on a substrate 1604, an insulating layer 1606 formed over the substrate 1604, a semiconductor layer 1608 formed on the insulating layer 1606 over the gate electrode 1602, first and second impurity doped semiconductor layers 1610a and 1610b formed on a first and a second side of the semiconductor layer 1608, respectively, a source electrode 1612 and a drain electrode 1614 formed on the first and second impurity doped semiconductor layers 1610a and 1610b, respectively, second insulating layer 1616 formed over the substrate 1604, and a conductive metal layer 1620 formed on a portion of the second insulating layer 1616 and contacting the drain electrode 1614 via a contact hole in the second insulating layer 1616.

PBG pixel electrode 1412 of the present invention, deposited on second insulating layer 1616 and positioned adjacent TFT 1414 (that is, to the immediate right of TFT 1414 in FIG. 16), includes a plurality of representative alternating metal layers 1630, 1632, and 1634, and interstitial layers 1636 and 1638, as described in connection with FIGS. 1–11. It should also be appreciated that when necessary, transparent PBG electrode 1412 can be alternatively deposited directly on substrate 1604 (that is, without interposing layers 1606 and 1616) to enhance transparency. Conductive metal layer 1620, connected to a metal film 1640 deposited on a side surface of PBG electrode 1412, applies a common voltage potential to all of the metal layers of electrode 1412, in a manner similar to that described in connection with FIG. 13. In an alternative connection arrangement, metal layer 1620 extends toward the rightmost end of PBG electrode 1412, and between interstitial layer 1638 and second insulating layer 1616, thus forming lower most metal layer 1634 of metal stack 1412. This arrangement can also be used when electrode 1412 is deposited directly on substrate 1604.

The TFT gate electrode 1602 is formed using a metal such as aluminum, chromium, and molybdenum. The source and drain electrodes 1612 and 1614 are formed using a metal such as aluminum, chromium, or molybdenum. The gate electrode 1602 is connected to the gate line 1408. The source electrode 1612 is connected to the data line 1410, and conductive layer 1620 connects the drain electrode 1614 to the PBG pixel electrode 1412.

When a scanning pulse (that is, a scanning voltage signal) is applied to the gate electrode 1602 of TFT 1414 through the gate line 1408, a data signal on the data line 1410 is transmitted from the source electrode 1612 to the drain electrode 1614 through the semiconductor layer 1608. The data signal received by the source electrode 1612 is applied to the PBG pixel electrode 1412 so as to establish a voltage (electric potential) difference between the PBG pixel electrode 1412 and the PBG common electrode 1522.

This induced voltage difference causes a change in the orientation of the liquid crystal molecules in LC layer 1530 between the PBG pixel electrode 1412 and the PBG common electrode 1522. In response to such a change in orientation of the molecules in the LC layer 1530, a light transmittance of the pixel varies to establish a visual difference between the pixel without the data voltage input and the pixel with the data voltage input. Collectively, these pixels, having visual differences, function as a display mechanism for the liquid crystal display. It should be appreciated that in LCD device 1400, a two port switching device, such as a diode can replace the three port switching device (that is, TFT 1414) described herein to selectively drive PBG electrodes 1412.

As mentioned above, the increased conductivity associated with the transparent PBG electrode advantageously results in a substantially increased responsiveness or speed of the transparent electrode, and thus the active matrix LCD device, relative to conventional LCD devices. Accordingly, the active matrix LCD device of the present invention is ideally suited to high frequency display scanning applications, such as computer and color television screen applications. Also, the substantial increase in conductivity advantageously results reduces power consumption in LCD devices of the present invention.

C. A Passive Matrix LCD Device

Figure 17:
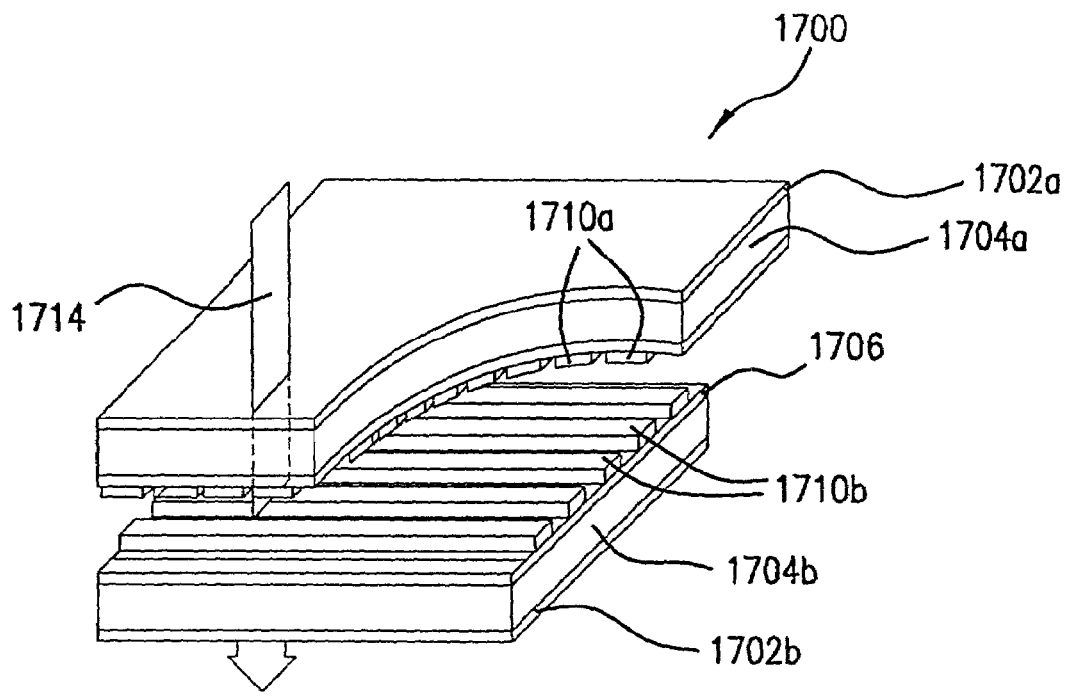
FIG. 17 is a partial perspective view of an embodiment of a passive matrix LCD device, in accordance with the present invention.

A partial perspective view of an embodiment of a passive matrix LCD device 1700 of the present invention, is depicted in FIG. 17. LCD device 1700 includes conventional upper and lower polarizing layers 1702a and 1702b, and respective upper and lower glass substrates 1704a and 1704b overlaying polarizing layers 1702a and 1702b. A conventional color filter 1706 overlays lower glass substrate 1704b.

A plurality of transparent X or row PBG electrodes 1710a and a plurality of transparent Y or column PBG electrodes 1710b of the present invention, deposited respectively on upper glass substrate 1704a and color filter 1706, crisscross each other in the LCD device. The cross over regions of PBG electrodes 1710a and 1710b together with an LC layer (not shown) between the electrodes form a matrix of display pixels with an LC layer contained between electrodes 1710a and 1710b. Turning on or off a selected display pixel, defined at the intersection between a selected one of the row PBG electrodes 1710a and a selected one of the column PBG electrodes 1710b, requires applying appropriate voltage signals to the selected row and column electrodes to thereby address the display pixel and control the passage of a light beam 1714 through the selected pixel region.

Figure 18:
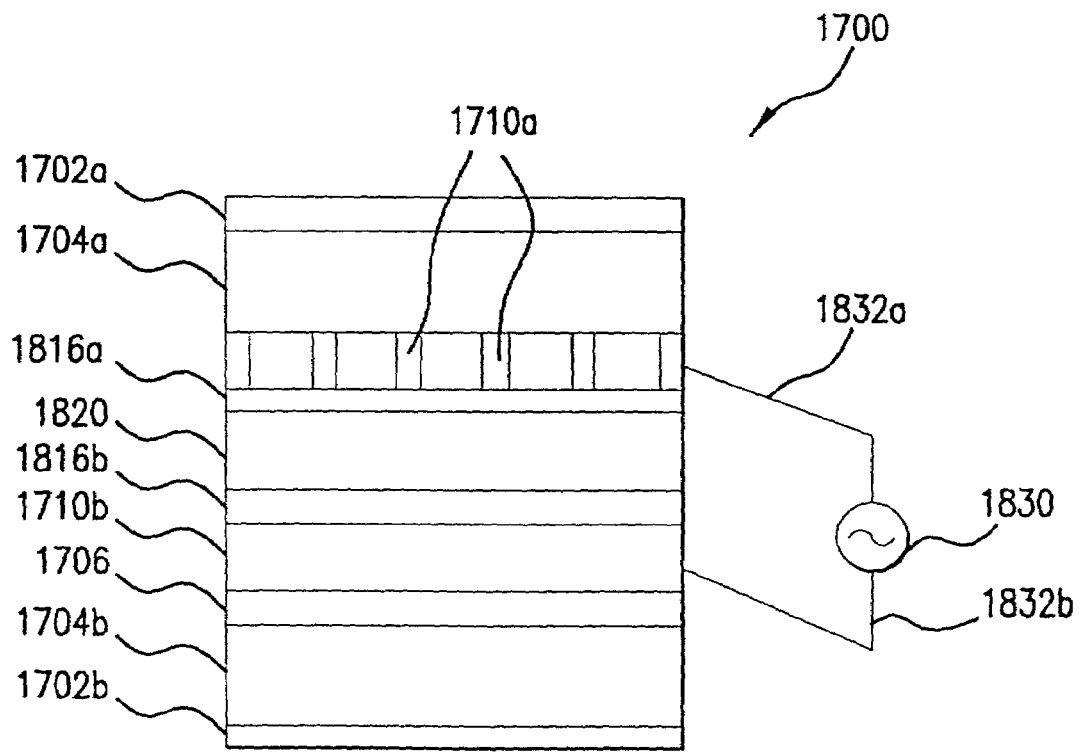
FIG. 18 is a side view of the passive matrix LCD device of FIG. 17.

A side view of passive matrix LCD device 1700 is depicted in FIG. 18. Device 1700 further includes conventional aligning layers 1816a and 1816b, and the LC layer 1820. A signal source 1830 applies voltage signals to selected ones of row PBG electrodes 1710a and column PBG electrodes 1710b via respective signal lines 1832a and 1832b.

III. Light Emitting Structures

A. Prior Art Light Emitting Diode

Figure 20:
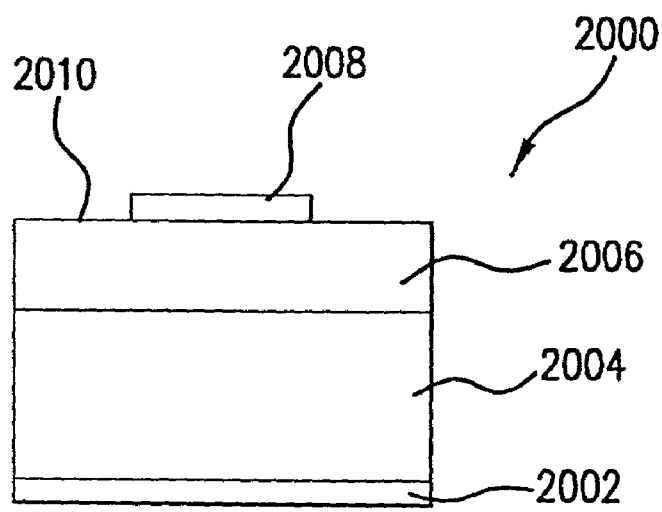
FIG. 20 is a cross-sectional view of a Prior Art LED device.

FIG. 20 is a cross-sectional view of a prior art Light Emitting Diode (LED) device 2000. Prior art LED 2000 includes an opaque cathode electrode layer 2002 at a base of the LED, a semiconductor substrate layer 2004 deposited on cathode electrode 2002, an active semiconductor layer 2006 deposited on semiconductor substrate layer 2004, and an anode electrode 2008 overlying active semiconductor layer 2006. In operation, active semiconductor layer 2006 emits visible light when the cathode and anode electrodes 2002 and 2008 apply a voltage across the active semiconductor layer. Anode electrode 2008 is typically made from a gold composition, and is sufficiently thick (for example, approximately 1.2 microns thick) as to be opaque to the visible light emitted by active semiconductor layer 2006. Therefore, anode electrode 2008 disadvantageously restricts a light emitting portion of prior art LED 2000 to a limited region 2010 positioned around or outside of the anode electrode. This can greatly reduce an efficiency of LED 2000 given the relatively large surface area of active semiconductor layer 2006 obscured by opaque anode electrode 2008. An ITO layer (not shown), deposited between anode electrode 2008 and active semiconductor layer 2006, is sometimes used to assist in distributing electrical currents across the active semiconductor layer to improve LED efficiency.

In the past, manufacturers have had trouble with low conductivities associated with active semiconductor layer 2006, such as a p-type active layer. Such low conductivities require manufacturers to grow an extremely thick p-type layer, on the order of fifty microns thick, in order spread injected electrical current from electrode 2008 throughout an entire junction region of the active layer. Without the thick active layer, the injected current is localized to the region beneath opaque electrode 2008, whereby the active layer tends to emit light only beneath the opaque electrode layer. Growing such thick active layers is expensive and time consuming.

B. Light Emitting Structures with PBG Transparent Metal Electrode

Figure 19:
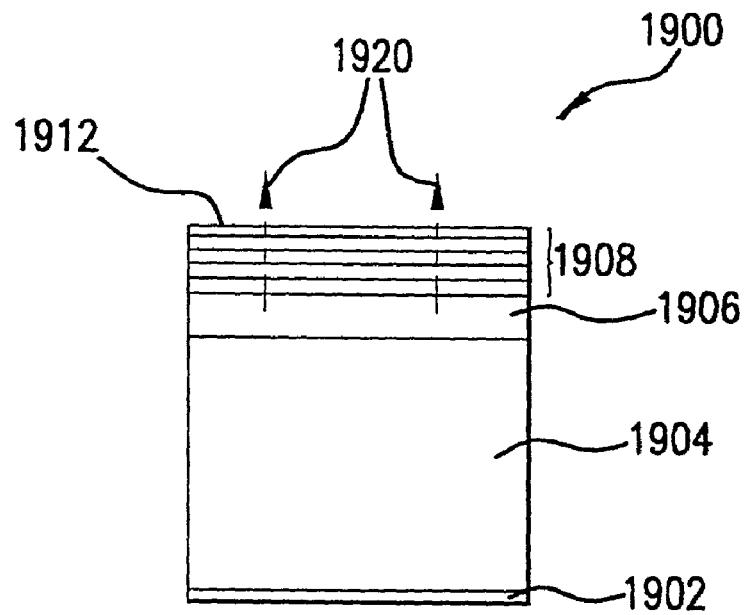
FIG. 19 is a cross-sectional view of an embodiment of a light emitting structure such as an LED or LEP device, in accordance with the present invention.

FIG. 19 is a cross-sectional view of an embodiment of a Light Emitting Structure (LES) 1900, according to the present invention. LES 1900 includes a cathode electrode layer 1902 at a base of LES 1900. Cathode electrode 1902 is adapted to have a first or negative voltage applied to the cathode electrode. A substrate layer 1904 is deposited on and overlays cathode electrode 1902. An active layer 1906 is deposited on and overlays substrate layer 1904. Active layer 1906 has the property of emitting light in the visible light region of the electromagnetic (EM) spectrum when a voltage is applied across the active layer.

A transparent anode electrode 1908 adapted to have a second or positive voltage applied thereto is deposited on and overlays active layer 1906. Transparent anode electrode 1908 is constructed as a transparent multi-layer stack as described above in connection with FIGS. 1–11. Therefore, transparent anode 1908 includes a transparent metal stack having a layered structure including alternating metal and interstitial layers formed on one another to exhibit a PBG structure for transmitting a visible wavelength range of the EM spectrum.

In operation, the negative and positive voltages are respectively applied to cathode and anode electrodes 1902 and 1908 to thereby apply a voltage potential difference across active layer 1906. In response to the applied voltage difference, active layer 1906 emits visible light in the direction of upward pointing arrows 1920. The visible light is transmitted through transparent anode 1908.

In an embodiment of LES 1900 referred to as the LED embodiment, LES 1900 is an LED device. In the LED embodiment, substrate layer 1904 is a semiconductor substrate layer, made of a silicone carbide (SiC) composition, for example. Also, active layer 1906 is an active semiconductor layer, made of a gallium nitride (GaN) composition, for example, that emits visible light (for example, blue light in the wavelength range of between 426 and 468 nanometers) in response to the applied voltage. In an alternative arrangement of the LED embodiment of LES 1900, one or more additional semiconductor layers can be interposed between layers 1902 and 1904, layers 1904 and 1906, and layers 1906 and 1908. An exemplary LED constructed in accordance with the present invention is a blue-light LED. However, it is possible to fabricate a transparent metal filter to operate as a transparent electrode for emitter (active) layers for any visible light emitter in the present invention. Therefore, the present invention is compatible with LEDs for emitting visible light in many different colors.

In an embodiment of LES 1900 referred to as the LEP embodiment, LES 1900 is an LEP device. The LEP device is sometimes referred to as an "organic" or "polymer" LED. In the LES embodiment, active layer 1906 is an encapsulated light emitting polymer layer, made of a poly(p-phenylene vinylene) (PPV) composition, for example, that emits visible light (for example, yellow or green light) in response to the applied voltage.

In another embodiment of LES 1900, both the anode and the cathode electrodes 1908 and 1902 are transparent electrodes formed of a PBG structure.

Use of transparent PBG anode electrode 1908 in the above described LES devices has at least the following advantages:

1) transparent metal layer 1908 can be deposited across the entire upper surface of active layer 1906, thereby efficiently delivering electrical current across the entire active layer upper surface such that the entire surface of the LES device remains conductive and transparent;

2) in the LED embodiment, a thickness of active semiconductor layer 1906 (for example, the GaN layer), can be reduced relative to thickness used in prior art devices, because transparent metal layer 1908 more efficiently spreads electrical current across the entire active semiconductor layer;

3) anode electrode 1908 has high transparency to visible light wavelengths, for example, on the order of 80% transparency;

4) anode electrode 1908 has a high surface conductivity, for example, on the order of less than 0.2 Ohm/sq.;

5) anode electrode 1908 is two to four times more efficient than semi-transparent electrodes made of non-PBG structures, such as known ITO structures and compositions;

6) anode electrode 1908 provides Electromagnetic Interference (EMI) shielding as a result of its high surface conductivity; and 7) anode electrode 1908 can have an increased surface area relative to known semi-transparent electrodes, due to its increased surface conductivity, thus leading to larger LESs.

A. Conclusion

While various embodiments of the present invention have been described above, it should be understood that they have been presented by way of example only, and not limitation. Thus, the breadth and scope of the present invention should not be limited by any of the above-described exemplary embodiments, but should be defined only in accordance with the following claims and their equivalents. Additionally, all articles and patent documents mentioned above are incorporated by reference herein.

What is claimed is:

1. A liquid crystal display (LCD) device for displaying an image, comprising:

first and second spaced transparent electrodes being constructed and arranged to have a voltage applied across the first and second transparent electrodes, the first transparent electrode including a transparent metal stack having a layered structure including alternating metal and interstitial layers formed on one another to exhibit a photonic band gap (PBG) structure for transmitting a visible wavelength range and suppressing a non-visible wavelength range of the electromagnetic spectrum; and a liquid crystal (LC) layer positioned between the first and second transparent electrodes for selectively displaying the image in response to the voltage applied across the first and second electrodes.

2. The device of claim 1, wherein the transparent metal stack includes a first metal layer having a first metal thickness;
a first interstitial layer having a first interstitial thickness formed on the first metal layer;
a second metal layer having a second metal thickness formed on the first interstitial layer;
a second interstitial layer having a second interstitial thickness formed on the second metal layer; and a third metal layer having a third metal thickness formed on the second interstitial layer,
wherein an arrangement of the metal and interstitial layers exhibits the photonic band gap structure.

3. The device of claim 2, further comprising at least one of:
a third interstitial layer having a third interstitial thickness formed on the third metal layer; and
a transparent substrate to support the first metal layer.

4. The device of claim 2, wherein the first, second, and third metal layers are selected from a group comprising all transition metal.

5. The device of claim 2, wherein the first, second, and third metal layers are selected from a group comprising silver, aluminum, copper, and gold.

6. The device of claim 2, wherein the first, second, and third metal layers are silver.

7. The device of claim 2, wherein the first, second, and third metal thicknesses are each between approximately 2.5 to 5 nanometers (nm) and approximately 40 to 60 nm.

8. The device of claim 2, wherein the first and second interstitial layers are selected from a group comprising semiconductor materials, ordinary dielectrics, and a combination of semiconductor and dielectric materials.

9. The device of claim 2, wherein the first and second interstitial layers comprise Magnesium Fluoride ($MgF_2$).

10. The device of claim 2, wherein
the first interstitial thickness is one of
between approximately 2.5 to 5 nanometers (nm), and
greater than 5 nm,
the second interstitial thickness is one of
between approximately 300 to 500 nm, and
greater than 500 nm.

11. The device of claim 2, wherein the first, second, and third metal layers are silver and the first, second, and third metal layer thicknesses are each approximately 27.5 nm, wherein the first and second interstitial layers are MgF2 and the first and second interstitial thicknesses are each approximately 156 nm, wherein the visible wavelength range comprises the group of wavelengths between approximately 400 and 700 nm, wherein the non-visible wavelength range comprises the IR and microwave wavelength regions, and wherein the transmission of the visible wavelength range corresponds to at least approximately 40 percent transmission and the transmission of the non-visible wavelength range corresponds to approximately 10–5 transmission.

12. The device of claim 2, further comprising:
a plurality of metal layers having the first metal thickness, wherein the second and third metal thicknesses equal the first metal thickness; and
a plurality of interstitial layers having the first interstitial thickness, wherein the second and third interstitial thicknesses equals the first interstitial thickness, wherein the plurality of metal and interstitial layers are arranged in an alternating manner, and wherein the plurality of metal and interstitial layers corresponds to the visible and non-visible wavelength ranges.

13. The device of claim 2, further comprising first and second signal lines, respectively connected to the first and second electrodes, for applying the voltage across the first and second electrodes, wherein the first signal line is connected to at least one of the alternating metal layers of the transparent metal stack.

14. The device of claim 1, wherein the non-visible wavelength range comprises the infrared (IR) region of the electromagnetic spectrum.

15. The device of claim 1, wherein the non-visible wavelength range comprises the ultraviolet (UV) region of the electromagnetic spectrum.

16. The device of claim 1, wherein the non-visible wavelength range comprises the infrared region to the microwave region of the electromagnetic spectrum.

17. The device of claim 1, wherein the second electrode includes a transparent metal stack having a layered structure including alternating metal and interstitial layers formed on one another to exhibit a photonic band gap (PBG) structure for transmitting a visible wavelength range and suppressing a non-visible wavelength range.

18. The LCD device of claim 1, further comprising:
first and second LC aligning layers, respectively positioned adjacent the first and second transparent electrodes and in contact with the LC layer, for aligning LCD molecules in the LCD layer in predetermined directions,
a first transparent substrate for supporting the first transparent electrode;
a second transparent substrate and a color filter for supporting the second transparent substrate; and
first and second polarizing filters respectively overlaying outer surfaces of the first and second transparent substrates.

19. The LCD device of claim 1, wherein the LCD device is a Twisted Nematic LCD device, wherein an orientation of LC molecules in the LC layer twists or rotates through an angle of 9° across the LC layer.

20. The LCD device of claim 1, wherein the LCD device is a SuperTwisted Nematic (STN) LCD device, wherein an orientation of LC molecules in the LC layer twists or rotates through an angle of between 180° and 270° across the LC layer.

21. The LCD device of claim 1, wherein the LCD device is a Double SuperTwisted Nematic (DSTN) LCD, wherein a first Super Twisted Nematic (STN) second compensating STN LCD cell are bonded together in a back-to-back configuration.

22. The LCD device of claim 1, wherein the LCD device is a Triple Super Twisted Nematic LCD device.

23. The LCD device of claim 1, wherein the LCD device is a Film Compensated Super Twisted Nematic LCD device, wherein a plastic film is used as a compensator.

24. The device of claim 1, wherein the first transparent electrode has a conductivity of at least two orders of magnitude greater than a conductivity of Indium Tin Oxide.

25. An active matrix liquid crystal display (LCD) device, comprising:
a transparent substrate;
a matrix of transparent pixel electrodes formed on the transparent substrate, each of the transparent pixel electrodes including a transparent metal stack having a layered structure including alternating metal and interstitial layers formed on one another to exhibit a photonic band gap (PBG) structure for transmitting a visible wavelength range and suppressing a non-visible wavelength range of the electromagnetic spectrum;
a switching device associated with each pixel electrode and being constructed and arranged to selectively apply a first voltage to the pixel electrode;
a transparent common electrode layer spaced apart from the matrix of pixel electrodes and being constructed and arranged to have a second voltage applied thereto; and
a liquid crystal layer positioned between the common electrode layer and the matrix of pixel electrodes to form a corresponding matrix of liquid crystal (LC) image pixels, whereby each image pixel in the matrix of image pixels selectively transmits light in response to a voltage applied across the image pixel by the common electrode and an associated pixel electrode to form an image on the display.

26. The device of claim 25, further comprising:

a plurality of scanning lines formed in a first direction on the substrate; and a plurality of data lines formed in a second direction on the substrate such that the scanning and data lines cross-over each other, and wherein each switching device is formed at a cross over portion between one of the scanning lines and one of the data lines, the switching device including first and second control inputs connected respectively to the one of the data lines and the one of the scanning lines, and an output connected to the pixel electrode for selectively applying a voltage to the pixel electrode in response to voltage signals on the ones of the scanning and data lines.

27. The device of claim 25, wherein the transparent common electrode includes a transparent metal stack having a layered structure including alternating metal and interstitial layers formed on one another to exhibit a photonic band gap (PBG) structure for transmitting a visible wavelength range and suppressing a non-visible wavelength range of the electromagnetic spectrum.

28. The device of claim 25, wherein conductivity of each transparent pixel electrode is at least two orders of magnitude greater than a conductivity of Indium Tin Oxide.

29. An passive matrix liquid crystal display (LCD) device, comprising:

a plurality of transparent first electrodes supported by a first substrate and extending in a first direction, the first electrodes being constructed and arranged to have a first voltage applied to selected ones of the first electrodes, each of the first electrodes including a transparent metal stack having a layered structure including alternating metal and interstitial layers formed on one another to exhibit a photonic band gap (PBG) structure for transmitting a visible wavelength range and suppressing a non-visible wavelength range of the electromagnetic spectrum;

a plurality of transparent second electrodes supported by a second substrate and spaced apart from the first electrodes, the second electrodes extending in a second direction to cross-over the row electrodes and being constructed and arranged to have a second voltage applied to selected ones of the second electrodes; and a liquid crystal (LC) layer positioned between the first and second electrodes and forming a matrix of LC pixel regions corresponding to the cross-over positions between the first and second electrodes, wherein each of the LC pixel regions selectively transmits light in response to a voltage applied across the pixel regions resulting from the first and second voltages, to thereby form an image.

30. A method of forming an image using a liquid crystal display (LCD) device, comprising:

exciting a liquid crystal layer between first and second electrodes in the LCD device by applying a voltage across the first and second electrodes, the first electrode including a transparent metal stack having a layered structure including alternating metal and interstitial layers formed on one another to exhibit a photonic band gap (PBG) structure for transmitting a first selected wavelength range and suppressing a second selected wavelength range.

* * * * *